(12) United States Patent
Zordan

(10) Patent No.: US 8,885,148 B2
(45) Date of Patent: Nov. 11, 2014

(54) SYSTEM AND METHOD FOR DESIGN OF LINEAR MOTOR FOR VACUUM ENVIRONMENT

(75) Inventor: Enrico Zordan, Norwalk, CT (US)

(73) Assignee: ASML Holding N.V., Veldhoven (NL)

(*) Notice: Subject to any disclaimer, the term of this patent is extended or adjusted under 35 U.S.C. 154(b) by 427 days.

(21) Appl. No.: 13/315,194

(22) Filed: Dec. 8, 2011

(65) Prior Publication Data
US 2012/0170016 A1    Jul. 5, 2012

Related U.S. Application Data

(60) Provisional application No. 61/429,672, filed on Jan. 4, 2011.

(51) Int. Cl.
| | |
|---|---|
| *G03B 27/58* | (2006.01) |
| *H02K 41/02* | (2006.01) |
| *G03F 7/20* | (2006.01) |
| *H02K 9/19* | (2006.01) |
| *H02K 9/22* | (2006.01) |
| *H02K 41/03* | (2006.01) |

(52) U.S. Cl.
CPC .............. *H02K 9/22* (2013.01); *G03F 7/70841* (2013.01); *H02K 9/19* (2013.01); *H02K 41/03* (2013.01); *G03F 7/70758* (2013.01)
USPC .... 355/72; 310/12.29; 310/12.19; 310/12.06; 310/12.02; 310/12.21

(58) Field of Classification Search
CPC . G03F 7/70758; G03F 7/70841; H02K 41/03; H02K 9/19; H02K 9/22
USPC ........ 355/72; 310/12.29, 12.19, 12.06, 12.02, 310/12.21; 29/593
See application file for complete search history.

(56) References Cited

U.S. PATENT DOCUMENTS

| | | | |
|---|---|---|---|
| 5,302,836 A | 4/1994 | Siu | |
| 6,084,319 A * | 7/2000 | Kamata et al. | 310/12.29 |
| 6,271,606 B1 | 8/2001 | Hazelton | |
| 6,555,828 B1 | 4/2003 | Bokor et al. | |
| 6,603,542 B1 | 8/2003 | Chase et al. | |
| 6,836,031 B2 * | 12/2004 | Emoto et al. | 310/12.21 |
| 6,972,499 B2 * | 12/2005 | Emoto | 310/12.25 |
| 7,218,020 B2 * | 5/2007 | Emoto | 310/12.04 |

(Continued)

FOREIGN PATENT DOCUMENTS

| | | |
|---|---|---|
| DE | 10 2009 015 903 A1 | 10/2010 |
| JP | 2003-172709 A | 6/2003 |

*Primary Examiner* — Peter B Kim
*Assistant Examiner* — Deoram Persaud
(74) *Attorney, Agent, or Firm* — Sterne, Kessler, Goldstein & Fox P.L.L.C.

(57) ABSTRACT

A linear motor for vacuum environment includes a core and a housing. The core includes a plurality of cooling plates and a plurality of electrical coils sandwiched between the plurality of cooling plates. The core further includes a plurality of thermally conductive epoxy layers positioned between the plurality of electrical coils and the plurality of cooling plates, and a plurality of shims located between the plurality of electrical coils and the plurality of cooling plates to determine a distance between the plurality of electrical coils and the plurality of cooling plates. The core is assembled and tested independently and before being assembled in the housing. The housing encloses the core and includes a body, a plurality of feed throughs, and a lid.

20 Claims, 32 Drawing Sheets

(56) References Cited

U.S. PATENT DOCUMENTS

| | | |
|---|---|---|
| 7,245,048 B2 * | 7/2007 | Fujii et al. .................. 310/12.01 |
| 2001/0048883 A1 * | 12/2001 | Falk et al. ..................... 417/417 |
| 2002/0070699 A1 | 6/2002 | Tanaka et al. |
| 2003/0141769 A1 | 7/2003 | Kubo |
| 2005/0002023 A1 | 1/2005 | Kreh et al. |
| 2006/0091732 A1 | 5/2006 | Onishi |
| 2009/0309427 A1 | 12/2009 | Menhart |
| 2009/0324858 A1 * | 12/2009 | Jaeger ............................. 428/34 |
| 2011/0169944 A1 | 7/2011 | Zhao et al. |
| 2013/0015725 A1 * | 1/2013 | Trammell .................. 310/12.26 |
| 2013/0015726 A1 * | 1/2013 | Trammell .................. 310/12.26 |
| 2013/0069449 A1 * | 3/2013 | Pharand et al. ............ 310/12.02 |
| 2013/0164687 A1 * | 6/2013 | Binnard et al. ................ 430/322 |

\* cited by examiner

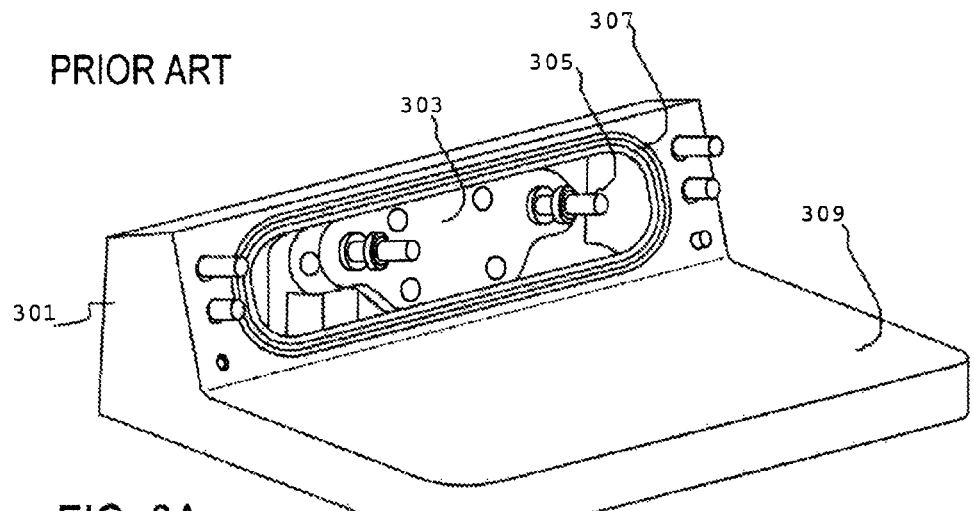
PRIOR ART
FIG. 3A
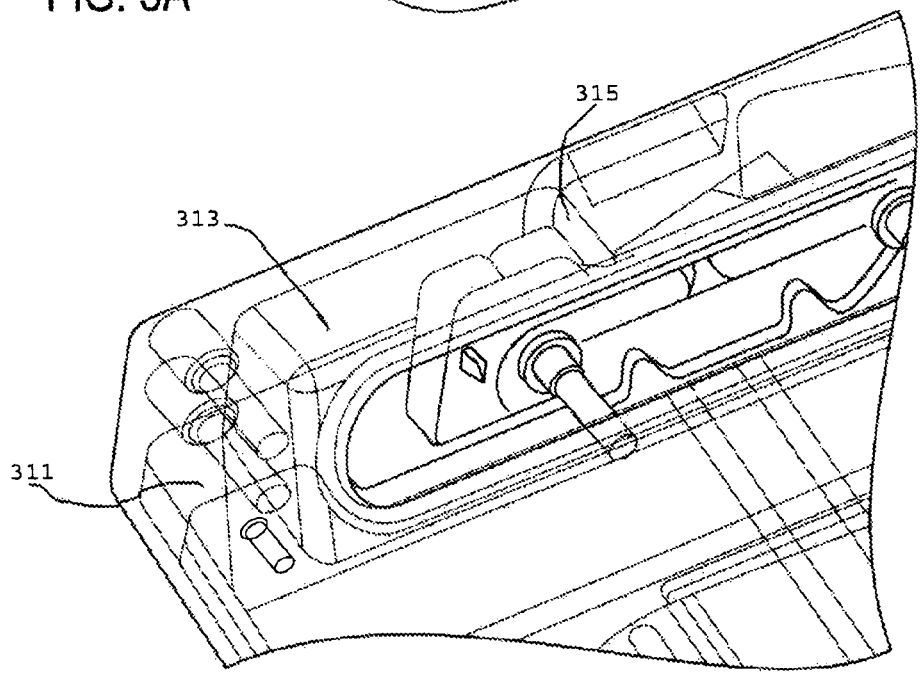
PRIOR ART  FIG. 3B

403

SYSTEM AND METHOD FOR DESIGN OF LINEAR MOTOR FOR VACUUM ENVIRONMENT

CROSS REFERENCE TO RELATED APPLICATIONS

This application claims the benefit under 35 U.S.C. §119(e) to U.S. Provisional Patent Application No. 61/429,672, filed Jan. 4, 2011, which is incorporated by reference herein in its entirety.

BACKGROUND

1. Field of the Invention

Embodiments of the invention generally relate to lithography, and more particularly to linear motors for a vacuum environment.

2. Background Art

Lithography is widely recognized as a key process in manufacturing integrated circuits (ICs) as well as other devices and/or structures. A lithographic apparatus is a machine, used during lithography, which applies a desired pattern onto a substrate, such as onto a target portion of the substrate. During manufacture of ICs with a lithographic apparatus, a patterning device, which is alternatively referred to as a mask or a reticle, is typically used to generate a circuit pattern to be formed on an individual layer in an IC. This pattern is transferred onto the target portion (e.g., comprising part of, one, or several dies) on the substrate (e.g., a silicon wafer). Transfer of the pattern is typically via imaging onto a layer of radiation-sensitive material (e.g., resist) provided on the substrate. In general, a single substrate contains a network of adjacent target portions that are successively patterned.

Linear motors are used with devices used to hold, for example, a patterning device (e.g., a mask or reticle), a wafer, etc., in order to move the patterning device and/or the wafer in X, Y, or Z directions. The linear XY motors can include flat electrical coils that are aligned within the high flux regions produced by X and Y magnetic circuits. The flat electrical coils are sandwiched with stainless steel water cooling jackets. The outer cooling jackets are brazed and welded to the overall coil housing, forming a seal coil enclosure. An important layer in assembling of the linear motors is a potting compound layer that (1) mechanically connects the coils to the cooling plates and the housing; (2) carries heat from the coils to the cooling plates; and (3) is the compliant layer for the thermal expansion of the coils. These functions are critical for operation of the motor. In particular, a thicker layer of the potting compound would be better for compliancy but bad for thermal conductivity, whereas a thin layer of the potting compound would be beneficial for thermal conductivity, but bad for compliancy.

The thickness of the layer of the potting compound between the coils and the cooling plates is affected by the dimensional variability of all other components of the motor. This layer is important from both a mechanical and a thermal point of view and the range of variability is such that a considerable portion of the manufactured motors would not meet the thermal requirements or would have reliability issues.

Welding of the motor housing introduces additional problems. Welding of the bottom cooling plate to the housing is one of the last manufacturing steps (because of the way the motor is assembled). Welding the bottom cooling plate to the housing as one the last manufacturing steps can result in burning the electrical insulation and therefore, the motor would not be vacuum tight. If the welding fails for any reason, a fully assembled motor would be lost without possibility of recovering any component.

Another draw back of prior motor designs is that the testability of sub-components is very limited. Some critical properties, such as thermal resistance and mechanical bonds strength, can only be measured and tested at the end of the motor manufacturing process.

SUMMARY

The inventor has determined that there is a narrow range of thickness of the potting compound layer that is optimal for both thermal and mechanical behavior that needs to be tightly controlled. Given the foregoing, what is needed are methods and systems that provide an improved linear motor for vacuum environment such that a distance between its electrical coils and its cooling plates can be deterministically optimized and different components of the motor can be assembled and tested independently.

In an embodiment of the invention a linear motor for vacuum environment includes a core and a housing. The core includes a plurality of cooling plates and a plurality of electrical coils sandwiched between the plurality of cooling plates. The core further includes a plurality of thermally conductive epoxy layers positioned between the plurality of electrical coils and the plurality of cooling plates, and a plurality of shims located between the plurality of electrical coils and the plurality of cooling plates to determine a distance between the plurality of electrical coils and the plurality of cooling plates. The core is assembled and tested independently and before being assembled in the housing. The housing encloses the core and includes a body, a plurality of feed throughs, and a lid.

In another embodiment of the invention, there is provided a method for fabricating a motor. The method includes assembling a core and inserting the core inside a housing. The method of assembling the core includes positioning a plurality of electrical coils between a plurality of cooling plates and positioning a plurality of thermally conductive epoxy layers between the plurality of electrical coils and the plurality of cooling plates. Further, the method of assembling the core includes positioning a plurality of shims between the plurality of electrical coils and the plurality of cooling plates to determine a distance therebetween and curing the plurality of thermally conductive epoxy layers. The core is configured to be tested before being inserted in the housing.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention. Together with the description, they further serve to explain the principles of the invention and to enable a person skilled in the relevant art(s) to make and use the invention.

FIGS. 3A-3D illustrate a conventional XY motor assembly.

Figure 1A:
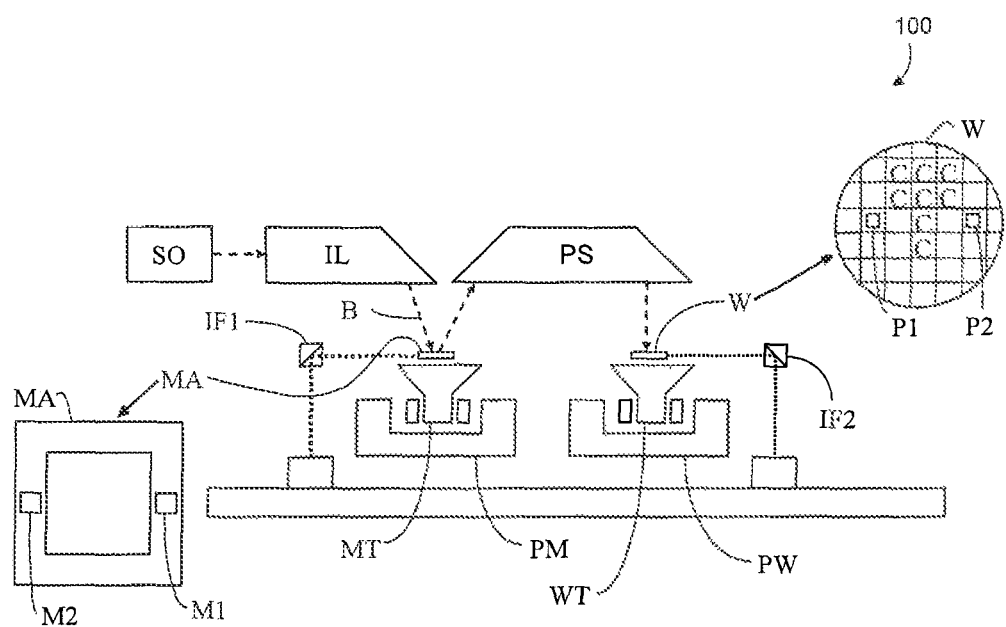
FIG. 1A is a schematic diagram of a reflective lithographic apparatus, according to an embodiment of the invention.

The figures herein are not drawn to scale. The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Overview

The present invention is directed to a linear motor for vacuum environments. This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Disclosed are improvements to design of linear motors for vacuum environment. The new design includes a core and a housing. The core, which includes all the functional components, includes a plurality of cooling plates and a plurality of electrical coils sandwiched between the plurality of cooling plates. The core also includes a plurality of thermally conductive epoxy layers positioned between the plurality of electrical coils and the plurality of cooling plates and a plurality of shims located between the plurality of electrical coils and the plurality of cooling plates to determine a distance between the plurality of electrical coils and the plurality of cooling plates. The use of the plurality of shims can deterministically define the gap between the plurality of electrical coils and the plurality of cooling plates and therefore, the thickness of the plurality of thermally conductive epoxy layer. The core is assembled and tested independently and before being assembled in the housing. The housing encloses the core and includes a body, a plurality of feed throughs, and a lid.

Before describing such embodiments in more detail, however, it is instructive to present an example environment in which embodiments of the present invention may be implemented.

II. An Example Lithographic Environment

A. Example Reflective and Transmissive Lithographic Systems

Figure 1B:
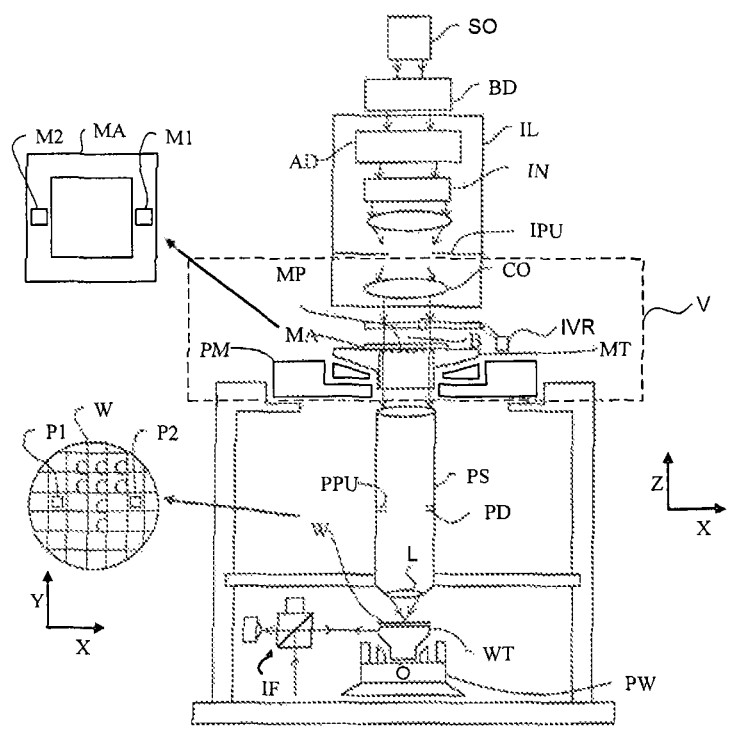
FIG. 1B is a schematic diagram of a transmissive lithographic apparatus, according to an embodiment of the invention.

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS is reflective, and in lithographic apparatus 100' the patterning device MA and the projection system PS is transmissive.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100, 100'—for example when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

B. Example EUV Lithographic Apparatus

Figure 2:
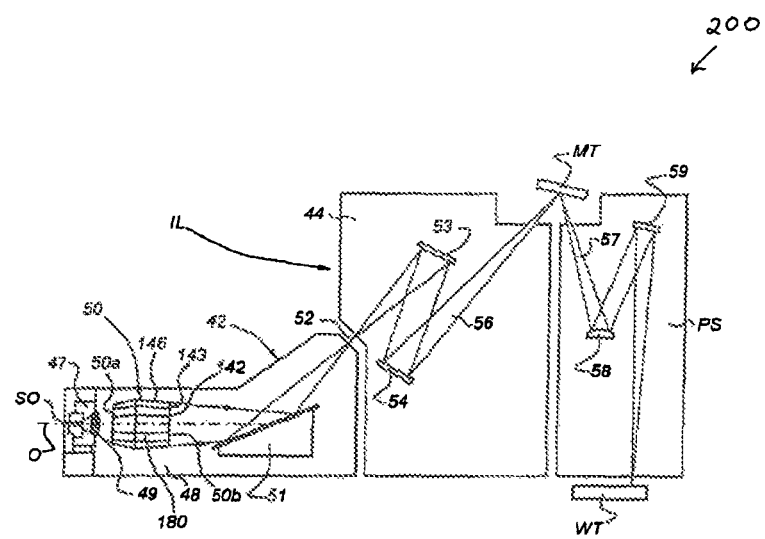
FIG. 2 is a schematic diagram of a reticle support system, according to an embodiment of the invention.

FIG. 2 schematically depicts an exemplary EUV lithographic apparatus 200 according to an embodiment of the present invention. In FIG. 2, EUV lithographic apparatus 200 includes a radiation system 42, an illumination optics unit 44, and a projection system PS. The radiation system 42 includes a radiation source SO, in which a beam of radiation may be formed by a discharge plasma. In an embodiment, EUV radiation may be produced by a gas or vapor, for example, from Xe gas, Li vapor, or Sn vapor, in which a very hot plasma is created to emit radiation in the EUV range of the electromagnetic spectrum. The very hot plasma can be created by generating at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 positioned in or behind an opening in source chamber 47. In an embodiment, gas barrier 49 may include a channel structure.

Collector chamber 48 includes a radiation collector 50 (which may also be called collector mirror or collector) that may be formed from a grazing incidence collector. Radiation collector 50 has an upstream radiation collector side 50a and a downstream radiation collector side 50b, and radiation passed by collector 50 can be reflected off a grating spectral filter 51 to be focused at a virtual source point 52 at an aperture in the collector chamber 48. Radiation collectors 50 are known to skilled artisans.

From collector chamber 48, a beam of radiation 56 is reflected in illumination optics unit 44 via normal incidence reflectors 53 and 54 onto a reticle or mask (not shown) positioned on reticle or mask table MT. A patterned beam 57 is formed, which is imaged in projection system PS via reflective elements 58 and 59 onto a substrate (not shown) supported on wafer stage or substrate table WT. In various embodiments, illumination optics unit 44 and projection system PS may include more (or fewer) elements than depicted in FIG. 2. For example, grating spectral filter 51 may optionally be present, depending upon the type of lithographic apparatus. Further, in an embodiment, illumination optics unit 44 and projection system PS may include more mirrors than those depicted in FIG. 2. For example, projection system PS may incorporate one to four reflective elements in addition to reflective elements 58 and 59. In FIG. 2, reference number 180 indicates a space between two reflectors, e.g., a space between reflectors 142 and 143.

In an embodiment, collector mirror 50 may also include a normal incidence collector in place of or in addition to a grazing incidence mirror. Further, collector mirror 50, although described in reference to a nested collector with reflectors 142, 143, and 146, is herein further used as example of a collector.

Further, instead of a grating 51, as schematically depicted in FIG. 2, a transmissive optical filter may also be applied. Optical filters transmissive for EUV, as well as optical filters less transmissive for or even substantially absorbing UV radiation, are known to skilled artisans. Hence, the use of "grating spectral purity filter" is herein further indicated interchangeably as a "spectral purity filter," which includes gratings or transmissive filters. Although not depicted in FIG. 2, EUV transmissive optical filters may be included as additional optical elements, for example, configured upstream of collector mirror 50 or optical EUV transmissive filters in illumination unit 44 and/or projection system PS.

The terms "upstream" and "downstream," with respect to optical elements, indicate positions of one or more optical elements "optically upstream" and "optically downstream," respectively, of one or more additional optical elements. Following the light path that a beam of radiation traverses through lithographic apparatus 200, a first optical elements closer to source SO than a second optical element is configured upstream of the second optical element; the second optical element is configured downstream of the first optical element. For example, collector mirror 50 is configured upstream of spectral filter 51, whereas optical element 53 is configured downstream of spectral filter 51.

All optical elements depicted in FIG. 2 (and additional optical elements not shown in the schematic drawing of this embodiment) may be vulnerable to deposition of contaminants produced by source SO, for example, Sn. Such may be the case for the radiation collector 50 and, if present, the spectral purity filter 51. Hence, a cleaning device may be employed to clean one or more of these optical elements, as well as a cleaning method may be applied to those optical elements, but also to normal incidence reflectors 53 and 54 and reflective elements 58 and 59 or other optical elements, for example additional mirrors, gratings, etc.

Radiation collector 50 can be a grazing incidence collector, and in such an embodiment, collector 50 is aligned along an optical axis O. The source SO, or an image thereof, may also be located along optical axis O. The radiation collector 50 may comprise reflectors 142, 143, and 146 (also known as a "shell" or a Wolter-type reflector including several Wolter-type reflectors). Reflectors 142, 143, and 146 may be nested and rotationally symmetric about optical axis O. In FIG. 2, an inner reflector is indicated by reference number 142, an intermediate reflector is indicated by reference number 143, and an outer reflector is indicated by reference number 146. The radiation collector 50 encloses a certain volume, i.e., a volume within the outer reflector(s) 146. Usually, the volume within outer reflector(s) 146 is circumferentially closed, although small openings may be present.

Reflectors 142, 143, and 146 respectively may include surfaces of which at least portion represents a reflective layer or a number of reflective layers. Hence, reflectors 142, 143, and 146 (or additional reflectors in the embodiments of radiation collectors having more than three reflectors or shells) are at least partly designed for reflecting and collecting EUV radiation from source SO, and at least part of reflectors 142, 143, and 146 may not be designed to reflect and collect EUV radiation. For example, at least part of the back side of the reflectors may not be designed to reflect and collect EUV radiation. On the surface of these reflective layers, there may in addition be a cap layer for protection or as optical filter provided on at least part of the surface of the reflective layers.

The radiation collector 50 may be placed in the vicinity of the source SO or an image of the source SO. Each reflector 142, 143, and 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc.

In the embodiments described herein, the terms "lens" and "lens element," where the context allows, may refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (e.g., having a wavelength λ of 365, 248, 193, 157 or 126 nm), extreme ultra-violet (EUV or soft X-ray) radiation (e.g., having a wavelength in the range of 5-20 nm, e.g., 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or Mine 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within lithographic apparatus. It should be appreciated that radiation having a wavelength in the range of, for example, 5-20 nm relates to radiation with a certain wavelength band, of which at least part is in the range of 5-20 nm.

III. Improved Linear Motor for Vacuum Environment

FIGS. 3A-3D illustrate a conventional XY motor assembly. The XY motor assembly 300 of FIG. 3A includes two racetrack shaped flat coils that are aligned within the high flux regions produced by the X and Y magnetic circuits. The XY motor coil assembly 300 includes a sealed coil housing and cooling jackets 301, a cooling water manifold 303, in/out feeding connections 305, an o-ring vacuum seal 307, and cover plates 309.

Each X and Y coils of the XY motor coil assembly 300 has two separate sections. Upper X motor coil 311 and upper Y motor coil 315 are illustrated in FIG. 3B. Stainless steel water cooling jackets are provided between the two separate sections of each of the X and Y coils (as illustrated in more details in FIG. 3D). Further, outer cooling jackets are used on outer sides of the two sections of each of the X and Y coils. The combination of the middle cooling jackets and the outer cooling jackets cool both faces of each coil section. FIG. 3B also illustrates the upper X coil sensor 313. The XY motor assembly 300 can include a plurality of sensors. For example, the XY motor assembly 300 can include temperature sensors used to measure the temperature of the X and Y motor coils. Additionally or alternatively, the XY motor coil assembly 300 can include safety sensors that can measure the temperature of the motor and halt the operation of the motor if the measure temperature would exceed a predetermined value.

The outer cooling jackets are brazed and/or welded to the overall coil housing forming the sealed coil housing 301. The coil housing surface of the coil housing 301 includes an o-ring seal 307 that allows electrical wires and cooling hoses (such as the in/out feeding connection 305) to exit to the vacuum environment.

Figure 3C:
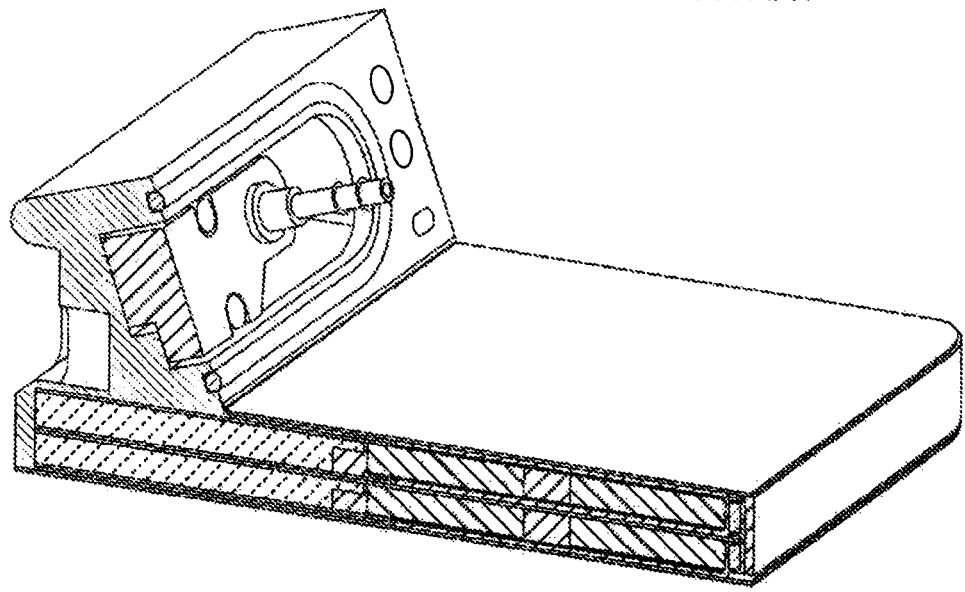
Figure 3D:
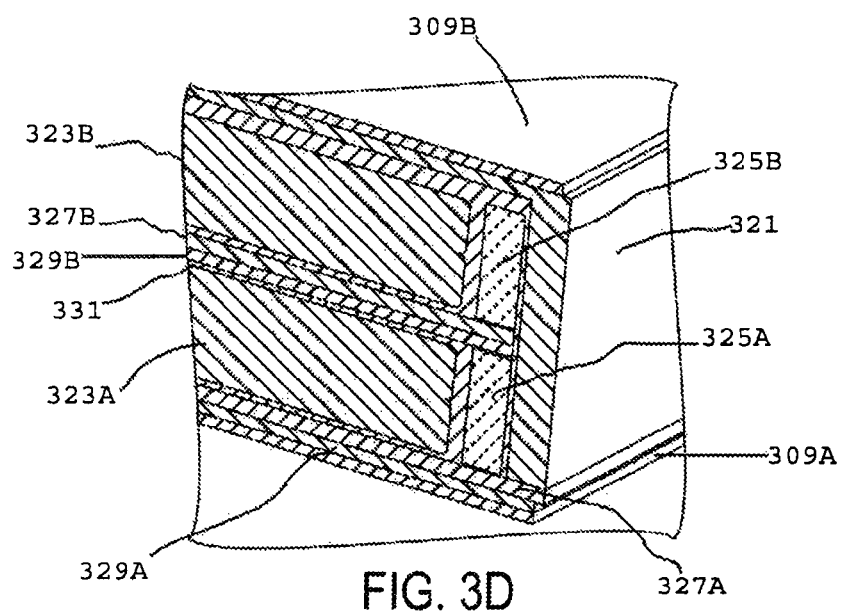

FIG. 3D illustrates a cross section of the XY motor coil assembly 300. Layers 309A and 309B are cover plates that seal the motor coil assembly 300. According to one example, the cover plates 309 are made of silicon carbide (SiC) plates. The housing 321 includes the coils 323A and 323B and the fiberglass frames 325A and 325B. The cooling plates of the XY motor assembly 300 include cooling plates (upper sheet and lower sheet) that are located between the coils 323A and 323B and cooling sheets that are located on the outer part of each of the coils 323A and 323B. For example, the coil 323A, which can be made of copper, is mechanically connected to a cooling plate (lower sheet) 327A and a cooling plate (upper sheet) 329B. The coil 323A is mechanically connected to the cooling plates 327A and 329B using the potting compound layer 331. The potting compound layer 331 is employed in assembling of the XY motor: (1) to mechanically connect the coils to the cooling plates and the housing; (2) to carry heat from the coil to the cooling plates; and (3) to be the compliant layer for the thermal expansion of the coils. These functions are important for operation of the XY motor 300. In particular, a thicker layer of the potting compound layer 331 is better for compliancy but bad for thermal conductivity, whereas a thin layer of the potting compound layer 331 is beneficial for thermal conductivity, but poor for compliancy. Therefore, there is a narrow range of thickness that is optimal for both thermal and mechanical behavior that needs to be tightly controlled.

The thickness of the potting compound layer 331 between the coil 323A and the cooling plates 327A and 329B is affected by the dimensional variability of all other components of the XY motor assembly 300. This layer is important from both a mechanical and a thermal point of view and the range of variability is such that a considerable portion of the manufactured motors would not meet the thermal requirements or would have reliability issues. The conventional design of the motors does not allow the potting compound layer 331 to have a deterministic thickness that can be optimized based on application. As a result, the nominal thermal resistance of the XY motor assembly 300 is too close to its limit and its value is widely spread due to conceptual design of the motor.

Further, because of pressure difference that exists between inside and the outside of the XY motor assembly 300 (inside the pressure is atmospheric pressure, however, outside of the XY motor assembly 300 is vacuum) the potting layer 331 is under constant stress that might cause more defect and catastrophic failure to the XY motor assembly 300. Also, the conventional design of the XY motor assembly 300 made connecting the coils (such as coil 323A) to the cooling plates (such as cooling plates 327A and 329B) very difficult. This is due to the variation and unpredictability of the thickness of the gap between the coils and the cooling plates. Small amount of the potting compound layer 331 would result in voids that results in high thermal resistance and hot spots. A thin layer of the potting compound layer 331 also created points with very high stress due to thermal expansion, which decreased the reliability of the XY motor assembly 300. On the other hand, too much of the potting compound layer 331 contaminated the welding area and resulted in a leaky weld.

According to the conventional motor assembly process, the cooling plate 327A was welded to the housing 321, for example, using a laser weld. The welding of the cooling plate 327A was one of the last manufacturing steps. Welding the cooling plate 327A to the housing 321 as one the last manufacturing steps often resulted in burning the electrical insulation and therefore, the XY motor assembly 300 would not be vacuum tight. If the welding fails for any reason, a fully assembled motor would be lost without the possibility of recovering any component.

Also, as mentioned before, another constraint with the conventional design was that the testability of sub components was very limited. Some critical properties, such as thermal resistance and mechanical bonds strength, could only be measured and tested at the end of the process of manufacturing the XY motor 300. Moreover, the conventional design of the XY motor 300 suffered from water leaks at the manifold 303, which resulted in catastrophic failures.

Figure 4A:
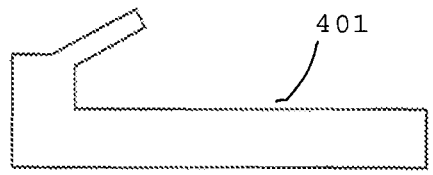
FIGS. 4A-4C illustrate a schematic of an improved assembly of an XY motor, according to an embodiment of the invention.
Figure 4B:
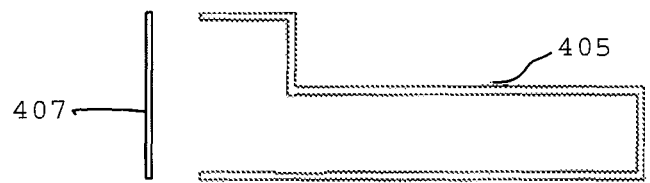
Figure 4C:
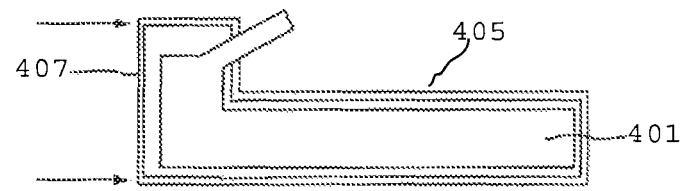

FIGS. 4A-4C illustrate a schematic of an improved assembly of the XY motor, according to an exemplary embodiment. According to this embodiment, assembling the XY motor consists of manufacturing, assembling, and testing a core 401 and a housing 403 separately and independently of each other. The core 401 and the housing 403 are assembled separate from each other and they are completely tested, before the core 401 is enclosed in the housing 403.

Figure 5A:
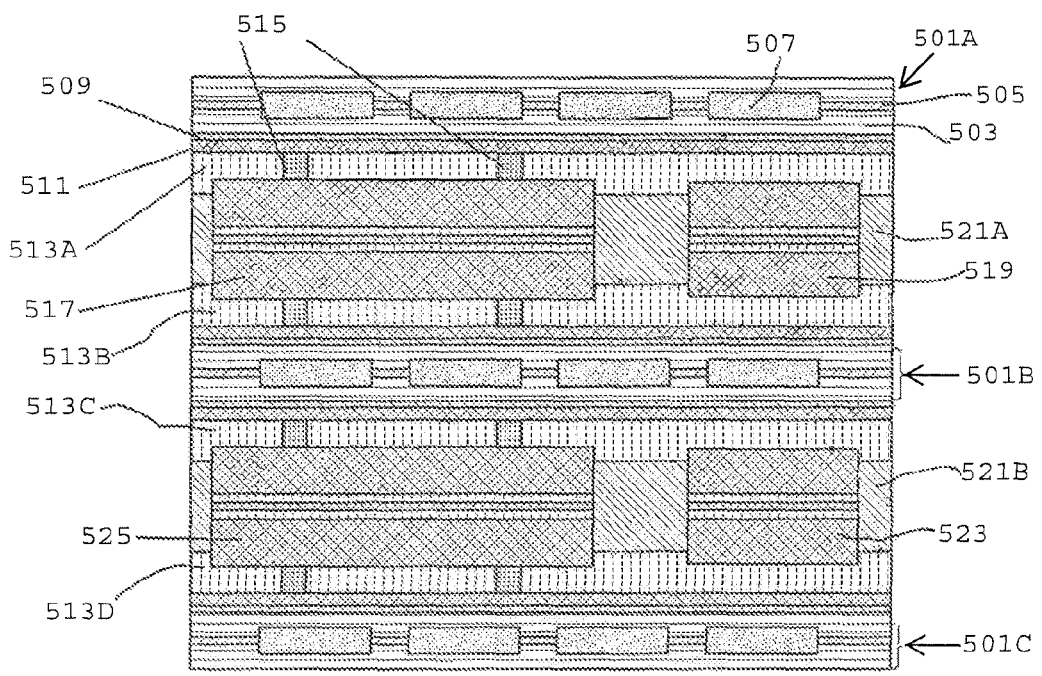
FIGS. 5A-5C illustrate the fabrication of the core of the XY motor assembly, according to an embodiment of the invention.
Figure 5B:
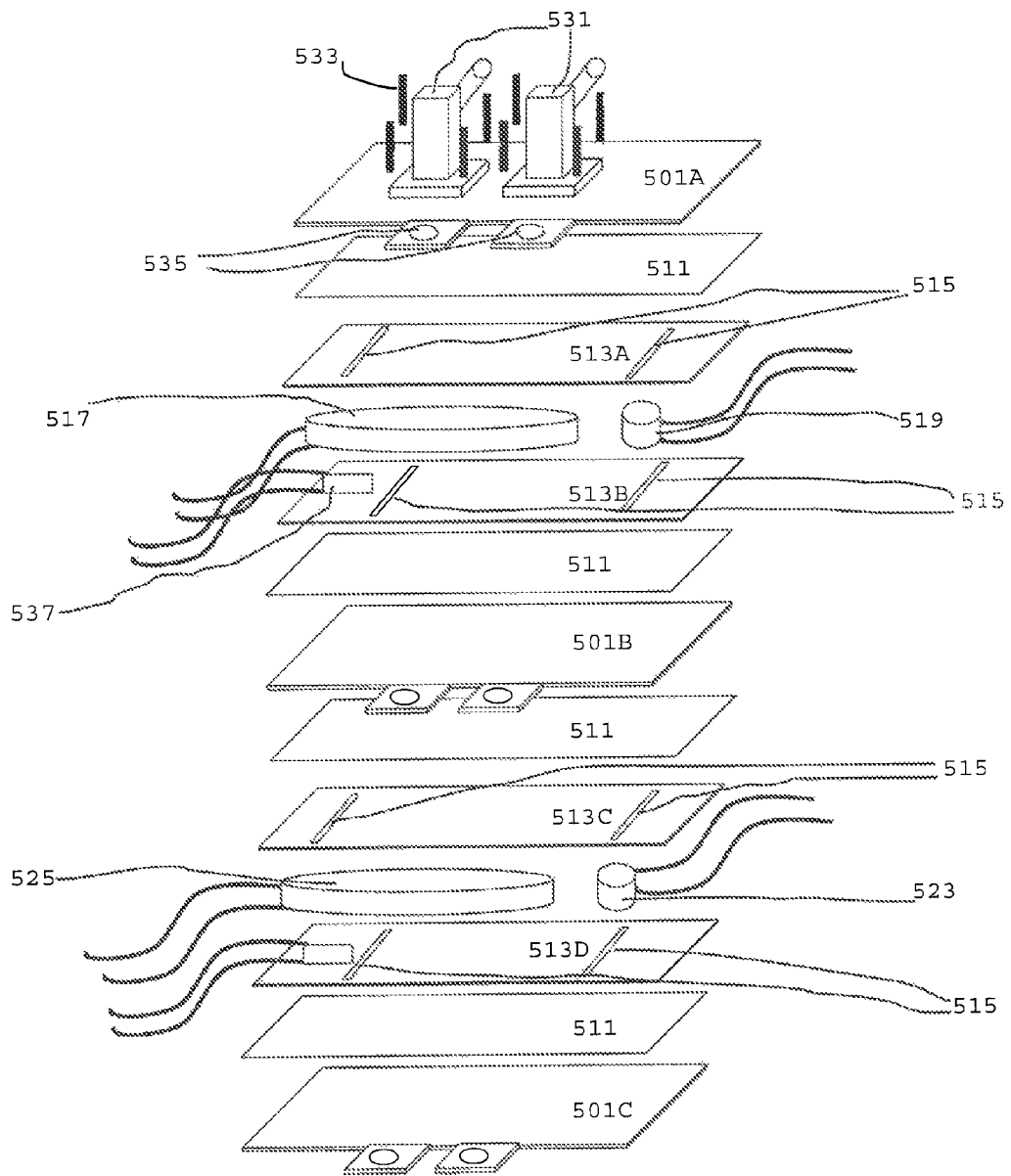
Figure 5C:
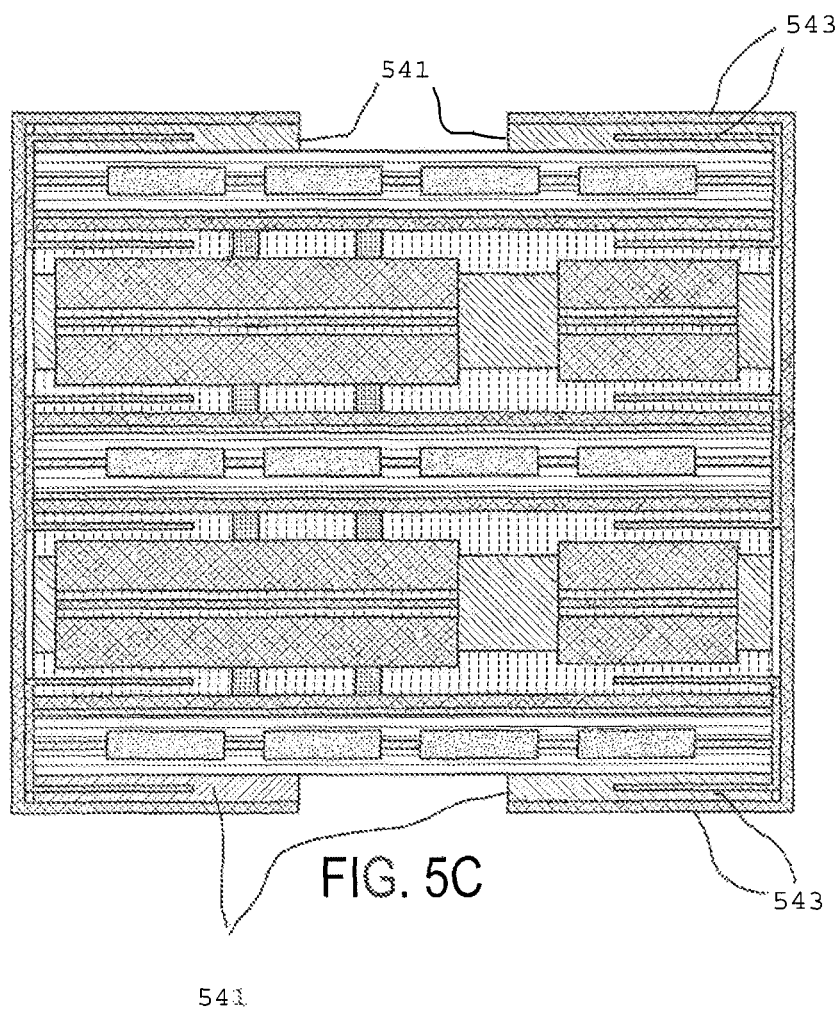

The core 401, as illustrated in more details in FIGS. 5A-5C, includes all the functional components of the XY motor, such as, but not limited to, the coils, the cooling plates, the sensors, etc. The core 401 is not exposed to vacuum, is fully functional by itself, and is fabricated and tested before being inserted in the housing 403.

The housing 403 of FIG. 4B is exposed to vacuum on the outside and its inner volume is sealed after the core 401 is inserted. The housing 403 includes a plurality of feed throughs (not shown in FIG. 4B) for electric wire and water connections of the core 401. These feed throughs are sealed after the wires and water connections of the core 401 are positioned. The housing 403 does not include any active components, e.g., cooling channels. After both the core 401 and the housing 403 are fabricated and tested, the core 401 is inserted in the housing 403, as illustrated in FIG. 4C. The lid 407 is welded and/or brazed to the housing. After the feed throughs are sealed, the housing 403 can be filled with glue (as illustrated in more details in FIG. 8).

FIGS. 5A-5C illustrate the fabrication of the core 401, according to an exemplary embodiment.

FIG. 5A illustrates the fabrication of the core 401, as different layers are assembled. In the exemplary embodiment of FIG. 5A, the core 401 includes X coil top structure 519, X coil bottom structure 523, Y coil top structure 517, and Y coil bottom structure 525. In one example, the X and Y coils can include flat wire copper coils (as illustrated in more details in FIGS. 12A-12D). The X and Y coils are sandwiched between the cooling plates 501A, 501B, and 501C (collectively cooling plates 501). Further, the thermally conductive epoxy layers 513A-513D (collectively thermally conductive epoxy layers 513) are located between the X and Y coils and the cooling plates. The shims 515 are also located (or otherwise positioned) between the X and Y coils and the cooling plates, and are configured to determine a distance between the coils and the cooling plates.

According to one embodiment, the cooling plate 501A includes two stainless steel plates 503 that are brazed together using a brazing material 505. The cooling plate 501A can also include cooling channels 507, such as water connections, that can be used for cooling. In one example, the plates 503 can be stainless steel 310S plates with thickness of approximately 0.6 mm and the brazing layer 505 can have a thickness of approximately 50-100 µm. However, the embodiments of this invention are not limited to these thicknesses and other material and/or thicknesses can be used. Cooling plates 501B and 501C can have similar or different structure in comparison to the cooling plate 501A.

The thermally conductive epoxy layers 513A-513D are located between the X and Y coils 519, 523, 517, and 525 and the cooling plates 501A-501C. The thermally conductive epoxy layers 513A-513D are adhesive layers that mechanically connect the X and Y coils to the cooling plates and are configured to dissipate heat from the X and Y coils to the cooling plates. In an example, the thermally conductive epoxy layers 513A-513D can be Epotek 7109-19 thermally conductive epoxy layers with thickness of approximately 80 µm. However, the embodiments of this invention are not limited to these materials and thicknesses, and other material and/or thicknesses can be used.

In order to overcome the shortcomings of conventional designs of the XY motors, the core 401 includes the shims 515 that are positioned (e.g., located or otherwise placed or inserted) between the X and Y coils and the cooling plates and therefore, determine the distance between the coils and the cooling plates. The shims 515 deterministically define the gap between the coils and the cooling plates and thus, the thickness of the thermally epoxy layers 513. Although only two shims are illustrated in each thermally conductive epoxy layer, it is contemplated that any number of shims can be used in each epoxy layer. The shims 515, which act as spacers, can be made of any electrically insulator material. In one example, the shims 515 can be made of Kapton.

In one example, the thickness of the gaps between the X and Y coils and the cooling plates (defined by shims 515) can be approximately equal at each layer. Alternatively, the gaps between the X and Y coils and the cooling plates (defined by shims 515) can have different thicknesses.

As illustrated in FIG. 5A, the core 401 can include a plurality of fiberglass frames 521 (collectively fiberglass frames 521) that are configured to support the X and Y coils. Further, additional layers can be included in the core 401 between the thermally conductive epoxy layers 513 and the cooling plates 501. For example, a thermosetting epoxy glue layer 509 and a Kapton layer 511 can be fabricated between the thermally conductive epoxy layers 513 and the cooling plates 501. The Kapton layer 511 is an electrical insulator, which, in one example, can be made of two layers with thickness of approximately 25 μm each. In another example, the thermosetting epoxy glue layer 509 can have a thickness of approximately 12 μm. However, the embodiments of this invention are not limited to these thicknesses and other material and/or thicknesses can be used. According to another example, the thermosetting epoxy glue layer 509 and the Kapton layer 511 can be connected together, before they are inserted in the core, as a sheet of Kapton. The Kapton sheet would be electrically insulating and the thermosetting epoxy glue layer would act as the adhesive material, such that the Kapton sheet would be connected to the cooling plates.

Accordingly, the use of the shims 515 can advantageously define the distances between the coils and the cooling plates in a deterministic manner. Therefore, the thickness of the thermally conductive epoxy layers 513 is increased (for example to approximately 80 μm, according to one example, in comparison to the conventional design that varies approximately between 0 to 150 μm). The increase in thickness can control the stress on, for example, the Kapton layer 511, especially due to thermal expansion of the coil, and therefore, can avoid Kapton delamination. Further, using the shims 515 can advantageously result in a repeatable and deterministic thermally conductive epoxy layers 513. Therefore, the thermal resistance of the core 401 and the stress on Kapton layer 511 will be repeatable and predictable and the overall performance of the XY motor will be more consistent. Moreover, thermal and mechanical behavior of the XY motor will be decoupled. The thermally conductive epoxy layers 513 will be responsible for the thermal behavior of the core, as the glue layers between the core 401 and the housing 403 (as explained in more details later) will be responsible for the mechanical tolerances of all the other components. Also, the average thermal resistance of the XY motor will advantageously be lowered.

According to one example, the cooling plates 501 can each have a thickness of approximately 1.2 mm, the thermosetting epoxy layer 509 and the Kapton layer 511 (together) can have a thickness of approximately 0.07 mm, and the gap between the coils and the Kapton layer 511 can have a thickness, for example, of approximately 0.08 mm. In this example, the thickness of the coils can each be approximately 4.1 mm.

FIG. 5B illustrates different layers of the core separately, according to one embodiment. Layers similar to the layers of FIG. 5A are labeled the same. Additionally, FIG. 5B illustrates the water connections 531 that are used as input and output manifolds for water for the cooling plates 501. The water connections 531 are bolted to the cooling plates 501 and/or cooling channels 535 using bolts 533. According to this exemplary embodiment, only two water connections are used in comparison to at least six water connections in conventional designs for the XY motors. This, advantageously, improves the manifold design for water leaks. The conventional design of the XY motor includes three cooling plates, which each cooling plate needs to be connected to an inlet and an outlet water connection. The conventional design needs separate in and out connections for water, therefore, a total of six connections. Thus, a special manifold is needed to be designed in the conventional design of the motor so it could adapt to misalignment of these six connections. This is very hard, which in some cases might result in water leaks. However, according to the embodiments of this invention, all the cooling plates are connected to the same water connections 531. Also, the water connections 531 are mechanically bolted to the cooling plate, therefore the water leak issue with the conventional design of the motor is improved.

Additionally, FIG. 5B illustrates the sensors 537 that can be fabricated in the core 401. The sensors 537 can include a wide range of sensors, such as temperature sensors, safety sensors, etc.

FIG. 5C illustrates another exemplary embodiment of the fabrication of the core 401 for compliancy with electrical safety regulations. In addition to the layers discussed with respect to FIG. 5A, the core of FIG. 5C includes additional thermosetting epoxy glue layers 541 and Kapton layers 543. Accordingly, additional thermosetting epoxy glue layers 541 are added over the outer layers of the cooling plates 501 with additional Kapton layers 543 covering the thermosetting epoxy glue layers 541. The embodiment of FIG. 5C advantageously result in compliant with electrical safety regulations.

It is important to note that there is a trade-off between the thermal performance and mechanical performance of epoxy layers. For example, thermally conductive epoxy can have high viscosity, therefore, it would be hard to flow it through small gaps. Because of this trade-off, it is an important design consideration that thermally conductive epoxy layer is located where dissipation of heat is important. Anywhere else in the motor, mechanically strong epoxy layers, are used. In the design on the XY motors based on the embodiments of this invention, the separation of the core from the housing advantageously allows that the thermally conductive epoxy is used in the core, between the coils and the cooling plates, where the dissipation of heat is very important. Further, when the core is fabricated, tested, and inserted in the housing, another epoxy glue, which has strong mechanical properties can be used to fill the housing.

Further, as the thermally conductive epoxy layer in the core and the mechanically strong epoxy layer in the housing are decoupled, the mechanically strong epoxy layer in the housing can be used to compensate for any tolerances in different layers in the core. The shims, which are positioned between the coils and the cooling plates, deterministically define the distance between the coils and the cooling plates, therefore they define the thickness of the thermally conductive epoxy layer. Thus, not only the coils and the cooling plates are mechanically connected using this epoxy layer, but also the thickness of the epoxy layer is optimized for transferring the heat. Since the shims will set the gap between the coils and the cooling sheets, any tolerances in other layers of the core can be compensated using the mechanically strong epoxy layer in the housing.

Figure 6A:
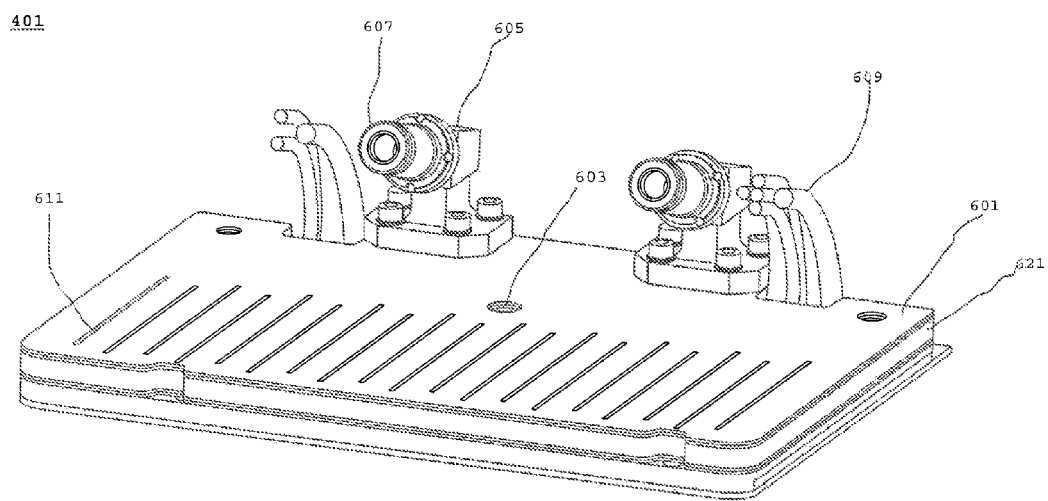
FIGS. 6A-6C illustrate an overall structure of the core of the XY motor assembly, according to an embodiment of the invention.
Figure 6B:
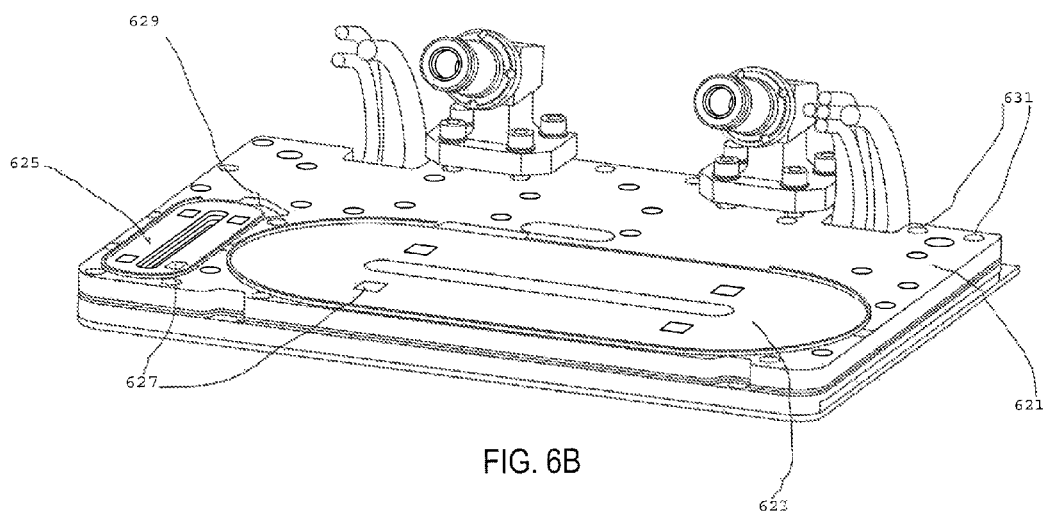
Figure 6C:
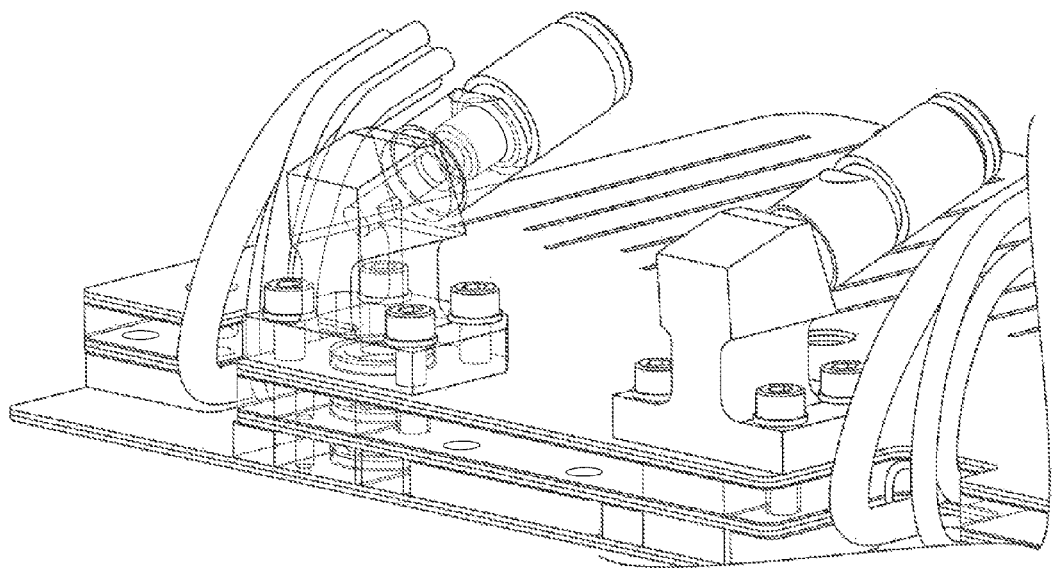

FIGS. 6A-6C illustrate the overall structure of the core 401, according to one exemplary embodiment.

In an example, the cooling plate 601 of the core 401 includes the mechanical connections 603 (such as pins, screws, etc.) (to connect the top and bottom cooling plates) and the cuts 611 to control eddy currents during the function of the motor. In the conventional design of the XY motors, the cooling plates, like other components of the motor, are mechanically connected only with glue layers. Because of the pressure difference between inside and outside of the motor, the pressure on the glue layers is very high. However, the additional mechanical connections 603 of this exemplary embodiment can advantageously increase the resistance of the core 401 against the pressure difference. FIG. 6A further illustrates the water connections 605, the in/out feeding connections 607, and the electrical wires 609. The water connections 605 are configured to be connected to in/out feeding tubes (not shown) using the in/out feeding connections 607. Also, the water connections 605 are mechanically connected (e.g., using bolts) to the cooling channels. Layer 621, which is also shown in FIG. 6B, is the fiberglass frame used to position the coils.

FIG. 6B illustrate the exemplary core 401, if the cooling plate 601 is removed. The fiberglass frame 621 is used to support the Y coil 623 and the X coil 625. Further, the shims 627 located on the Y coil 623 and the X coil 625, are illustrated in FIG. 6B, that are configured to define the gap between the coils and the cooling plates. Moreover, the fiberglass frame 621 can be used to support the sensors 629.

FIG. 6B also illustrates that spacers 631 can be built on the fiberglass frame 621, which are raising above the surface of the fiberglass frame 621, in order to create a gap between the fiberglass frame 621 and the cooling plate (for example, cooling plate 601) such that the thermally conductive proxy layer can be flown in the gap between the fiberglass frame 621 and the cooling plate.

FIG. 6C further illustrates another view of the core 401, according to this exemplary embodiment. The assembly of the core 401 separately from the housing 403 advantageously improves the testing capabilities at sub-assembly level to detect defects and failures before the motor if fully assembled, therefore, increases the testability of core sub-components. According to one embodiment, a sub-assembly process is used to fabricate and assemble critical components of the core, such as coils, Kapton, cooling plates, sensors, and glue layer, which can be fully tested before final integration. The testing can include, but not limited to, coil capacity, motor constant, insulation, thermal resistance, Hi-pot (high potential), pull test for bond strength, flow rate/pressure drop, etc.

Figure 7A:
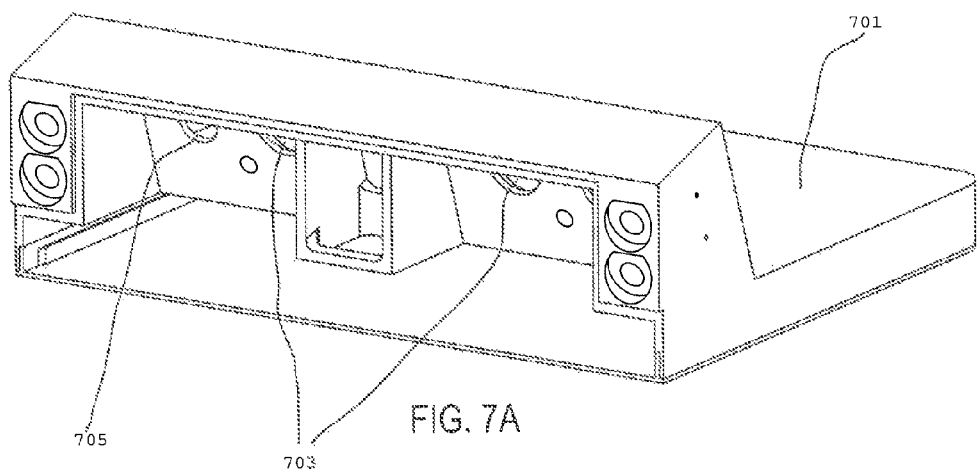
FIGS. 7A and 7B illustrate the back and front view of the housing of the XY motor assembly, according to an embodiment of the invention.
Figure 7B:
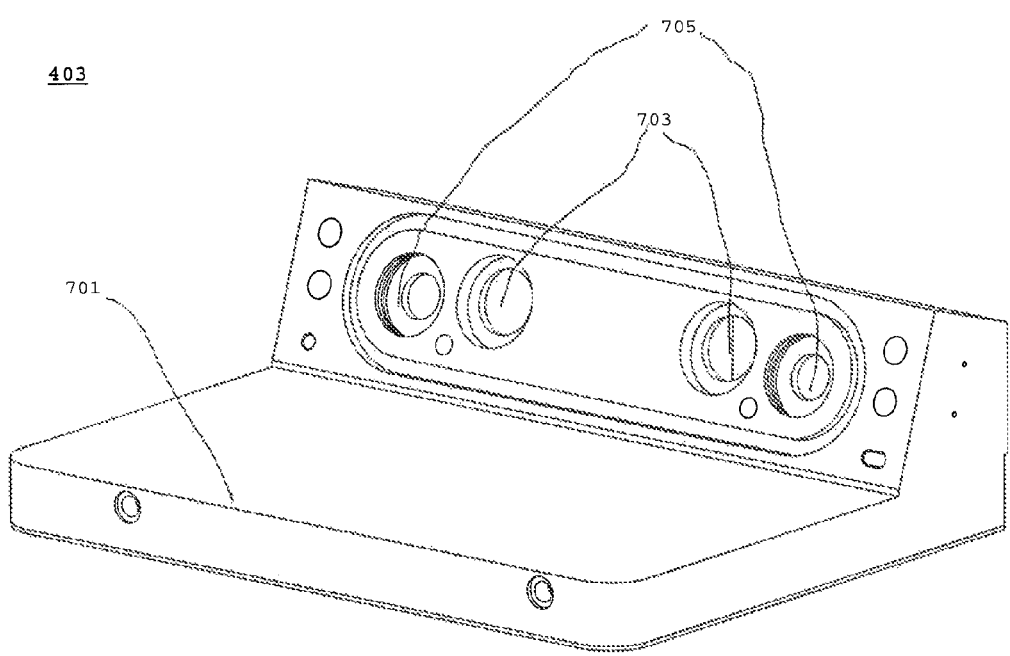

FIGS. 7A and 7B illustrate the back and front views of the housing 403, according to an exemplary embodiment. In this example, the housing 403 includes the body 701 that encloses the core 401. The body 701 includes the plurality of feed throughs 703 and 705. The feed throughs 703 can be used to pass through the in/out feeding connections of the core 401. Additionally, the feed throughs 705 can be used to pass through the electrical wires of the core 401. The plurality of feed throughs 703 and 705 are sealed after the electrical wires and the in/out feeding connections of the core 401 are positioned.

Figure 8:
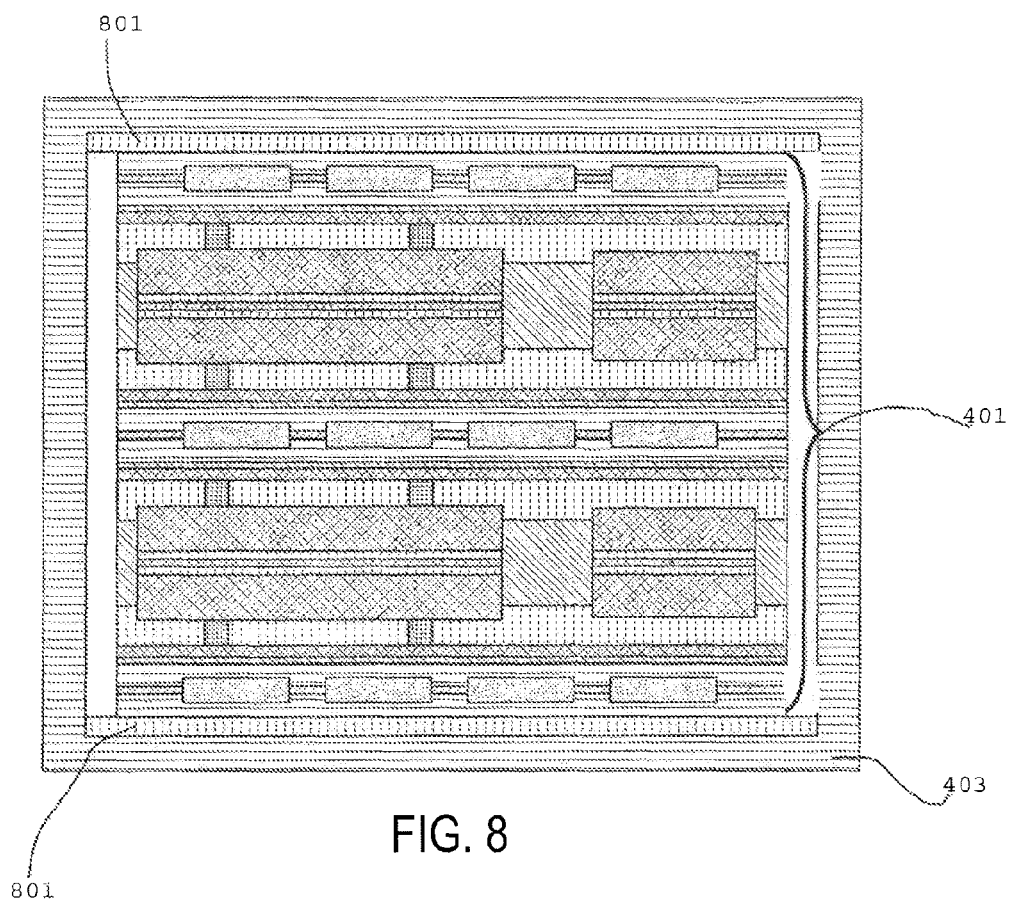
FIG. 8 illustrates the assembly of the core inside the housing of the XY motor assembly, according to an embodiment of the invention.

FIG. 8 illustrates the assembly of the core 401 inside the housing 403, according to one exemplary embodiments. In this example, the assembly of different layers of the core 401 are similar to FIG. 5A. Additionally, FIG. 8 illustrates glue layers 801 located between the core 401 and the housing 403. The glue layers 801 are mechanically strong glue layers determined by tolerance stack up and have only structural functions. Therefore, the use of shims 515 and thermally conductive epoxy layers 513 in FIG. 5A, and the glue layers 801 can effectively and advantageously decouple the thermal and mechanical properties of the XY motor. The thermally conductive epoxy layers 513 will be responsible for the thermal properties of the core, as the glue layers 801 are responsible for the mechanical tolerances of all the other components.

According to one example, the glue layers 801 can each have a thickness of approximately 0.25 mm and the housing 403 can have a thickness of approximately 1 mm. In this example, the thickness of the assembled core 401 and the housing 403 (including the glue layers 801) can be approximately 15 mm.

It is noted that the disclosed dimensions are provided as examples and not as limitation. Other dimensions and ranges are contemplated to be within the scope of the invention.

FIGS. 9A-9E illustrate the process of assembling the core 401 inside the housing 403 and back, front, and a cross section of the assembled XY motor, according to one exemplary embodiment.

Figure 9A:
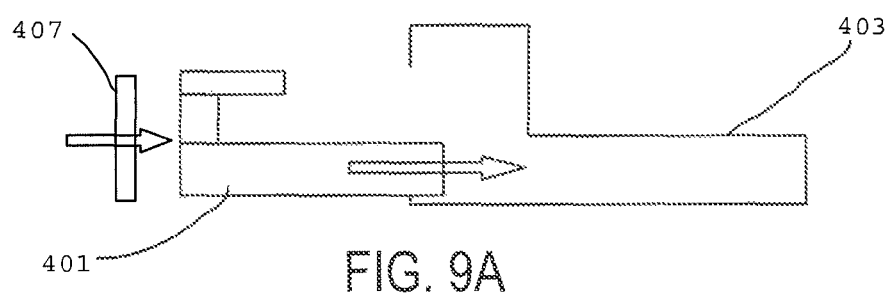
FIGS. 9A-9E illustrate the process for assembling the core inside the housing of the XY motor assembly, and the assembled XY motor, according to an embodiment of the invention.
Figure 9B:
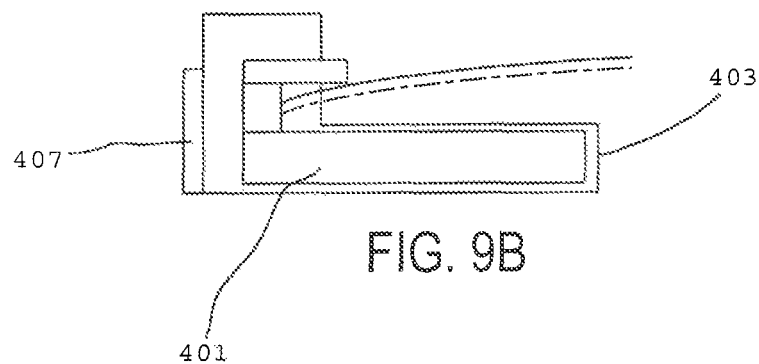
Figure 9C:
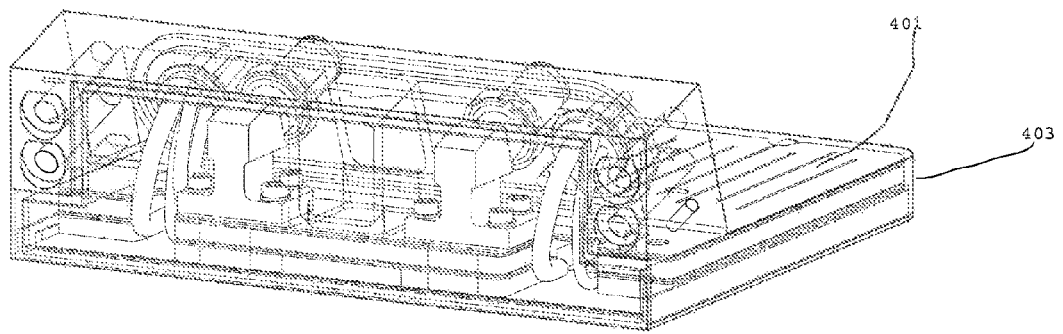
Figure 9D:
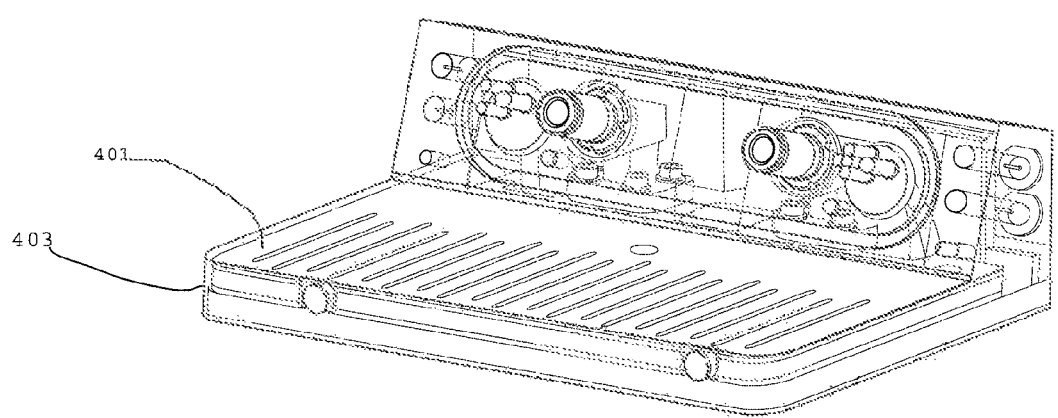
Figure 9E:
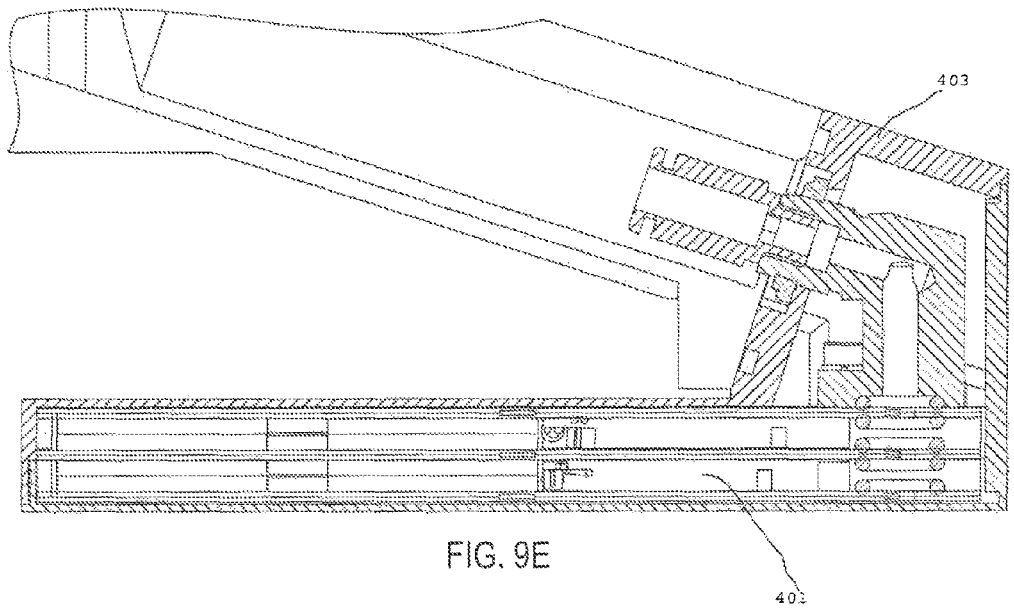

According to one example, after the core 401 is assembled (as illustrated in, for example, FIGS. 5A-5C) and tested, the core 401 is inserted in the housing 403, as shown in FIG. 9A. The housing 403 has also been assembled and fully tested before the core 401 is inserted. The lid 407 is welded to the body of the housing 403 prior to filling the motor with glue and welding of the lid 407 is performed in an area that is far from any sensitive/delicate component. Therefore, the probability that the welding would harm any sensitive component of the core 401 is advantageously very lower in comparison with the conventional designs of the XY motors. Further, since the filling of the motor with the glue is performed after the lid 407 is welded to the body of the housing 403, glue contamination problems are solved as well as insulation burning risks. FIG. 9B illustrates a schematic of the assembled core 401 inside the housing 403 when the lid 407 is welded to the body of the housing. FIGS. 9C-9E illustrate the back, the front, and the cross section of the assembled core 401 inside the housing 403, respectively.

Figure 10A:
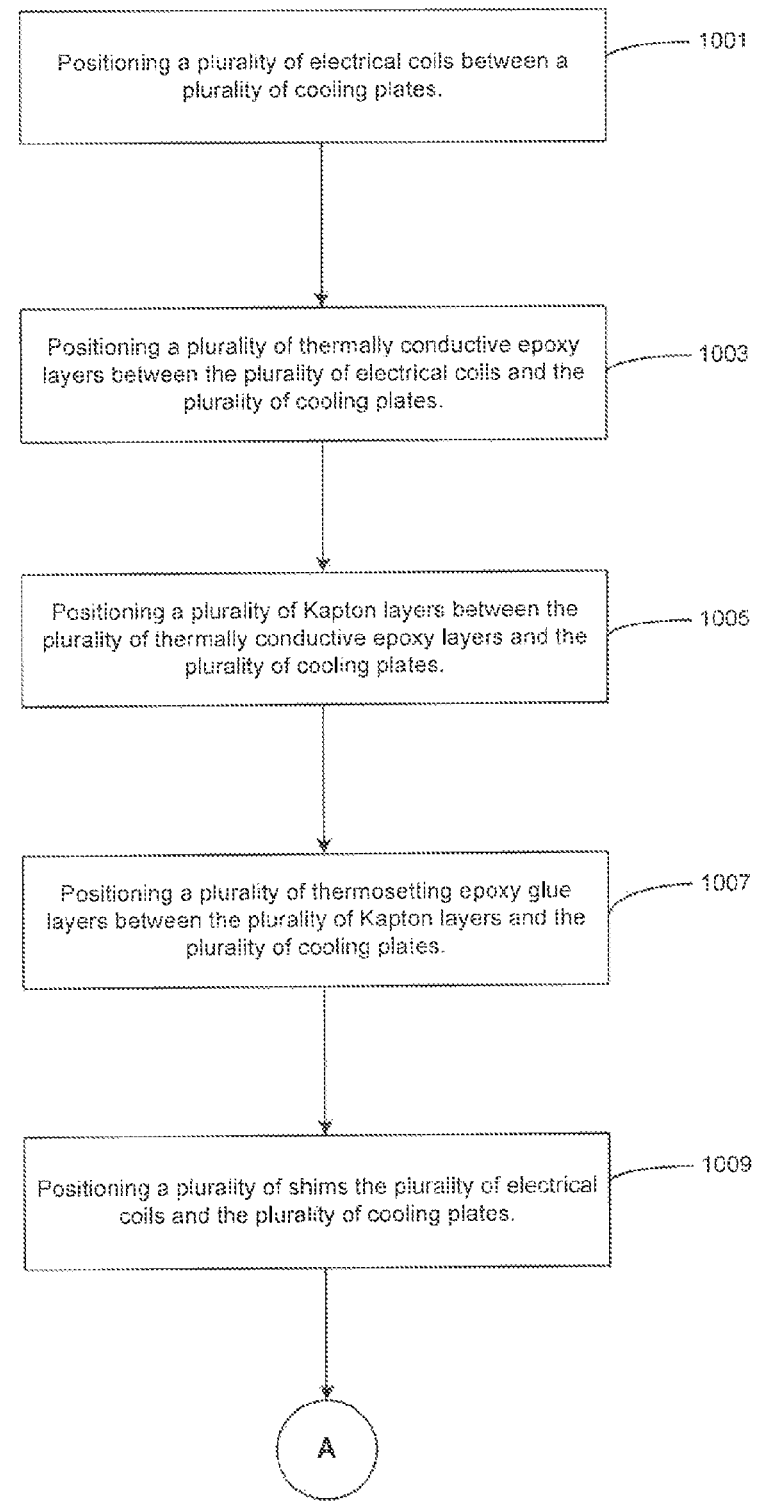
FIGS. 10A and 10B are flowcharts of an exemplary process for manufacturing and assembling the XY motor assembly, according to an embodiment of the invention.
Figure 10B:
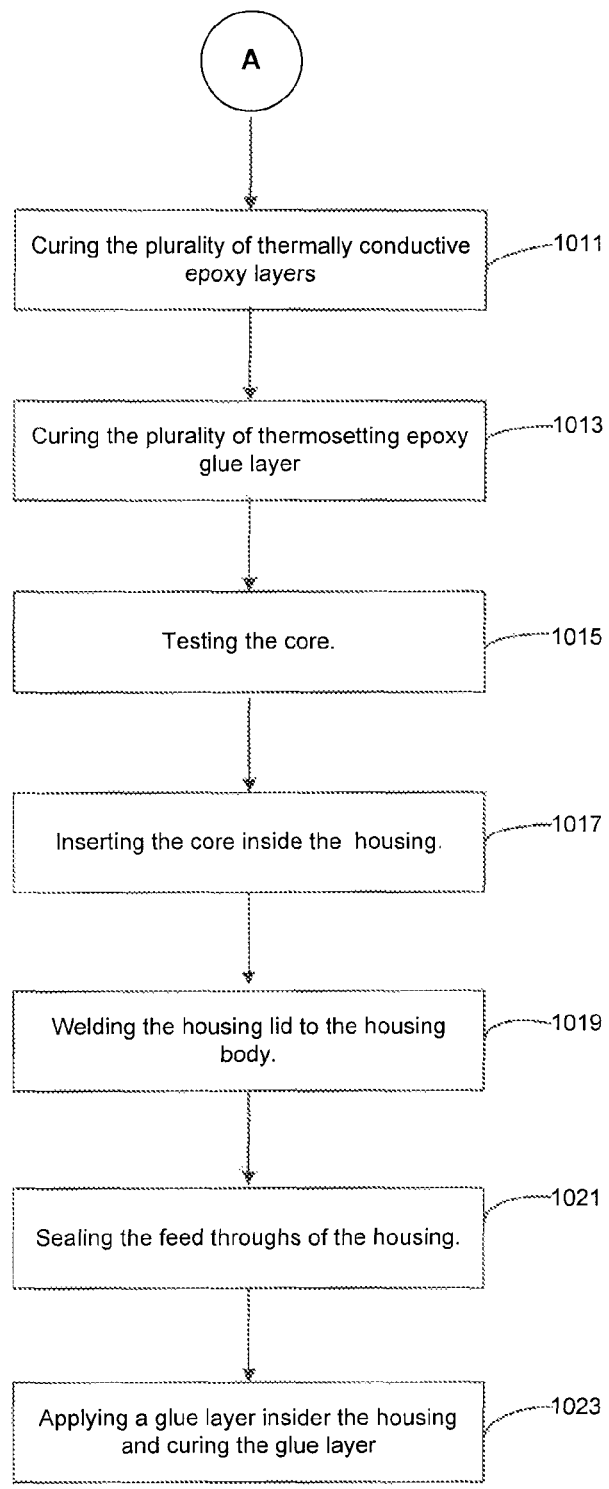

FIGS. 10A and 10B are flowcharts of an exemplary process 1000 for manufacturing and assembling the XY motor, according to one embodiment.

In step 1001, a plurality of electrical coils are positioned (e.g., located or otherwise placed or inserted) between a plurality of cooling plates. An example of step 1001 is shown in FIG. 5B, where the plurality of coils (X coils 519 and 523, and Y coils 517 and 525) are positioned between the cooling plates 501. In this example, the sub-components (electrical coils and the cooling plates) have been previously manufactured. According to one embodiment, the cooling plates can include stainless steel plates brazed and/or welded together, water and/or cooling channels, and/or water connections (bolted with the cooling plates and/or cooling channel). In another embodiment, in step 1001, a plurality of fiberglass frames (such as frames 521 of FIG. 5A) can be positioned between the electrical coils to support the coils.

In step 1003, a plurality of thermally conductive epoxy layers (such as layers 513 of FIG. 5B) are positioned between the plurality of the electrical coils and the plurality of cooling plates.

In step 1005, a plurality of Kapton layers (such as Kapton layers 511 of FIG. 5B) are positioned between the thermally conductive epoxy layers and the cooling plates. Further, in step 1007, a plurality of thermosetting epoxy layers (such as layers 509 of FIG. 5A) are positioned between the Kapton layers and the cooling plates.

In step 1009, a plurality of shims (such as shims 515 of FIG. 5B) are positioned between the plurality of electrical coils and the plurality of cooling plates to determine a deterministic distance (and/or a plurality of deterministic distances) between the coils and the cooling plates. In steps 1011 and 1013, the thermally conductive epoxy layers and the thermosetting epoxy glue layers are cured.

It is noted that steps of the process of manufacturing the core, as discussed above, are not limited to this sequence and can be performed in different sequences, as known to the person with ordinary skills in the art.

Also, although not shown in the flowchart of FIGS. 10A and 10B, other components essential for the operation of the XY motor can be fabricated and assembled in the core. For example, one or more sensors, water manifolds, electrical wiring, etc., can be assembled to the core, as part of process 1000.

After the core is fully assembled, it is tested in step 1015. The testing can include, but not limited to, Hi-pot testing, testing for leaks, thermal resistance testing, etc. Therefore, the core can advantageously be assembled and tested before it is inserted in the housing.

In step 1017, the assembled and tested core is positioned in the housing. Although not shown in the process 1000, the housing has already been built, welded, and tested, before the core is inserted in the housing. In one example, the housing can be made of titanium. The position of the core inside the housing can be held using drops of fast curing epoxy. As part of step 1017, the electric wires of the coils and sensors of the core and/or the in/out water connections are passed through the feed throughs of the housing and all the connections are tested. Also, according to one example, a fiberglass frame can be inserted in an empty volume behind the core to hold the wires in place and decrease amount of glue needed to fill the volume.

In step 1019, the lid of the housing is attached (e.g., welded and/or brazed) to the back of the housing body, from where the core was inserted in the housing. In step 1021, the feed throughs of the housing (that are used, for example, for electrical wires and in/out water connections) are sealed with glue so the housing is isolated from the outside.

In step 1023, one or more layers of glue are applied (e.g., injected) inside the housing and are cured. In one example, the one or more layers of glue can be any glue (they do not need to be thermally conductive, but preferably have low viscosity to fill the gaps).

Figure 11A:
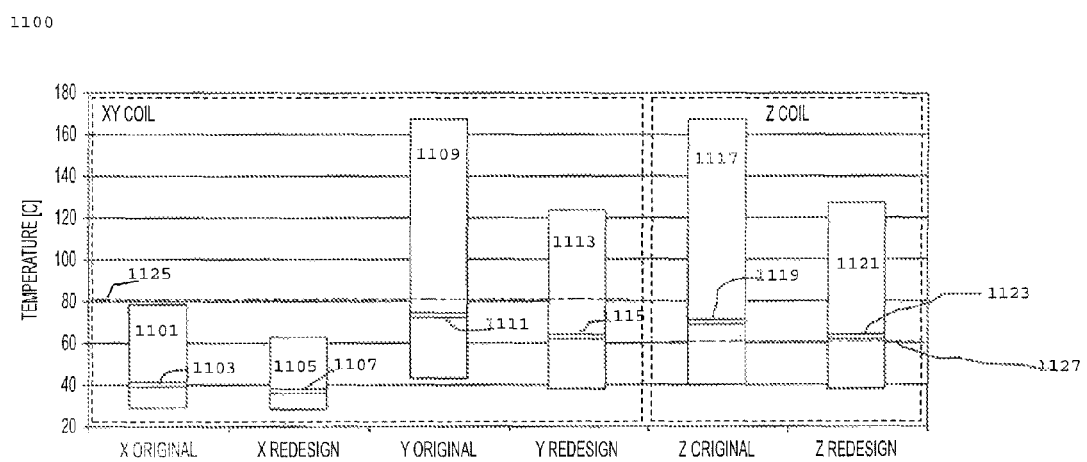
FIG. 11A illustrates a graph comparison of working temperature of X, Y, and Z coils between the conventional design and the design of the embodiments of the invention.

FIG. 11A illustrates a graph comparison of working temperature of X coils, Y coils, and Z coils between the conventional design and the design of the embodiments of this invention.

For example, graphs 1101 and 1105 illustrate the range of working temperatures for X coil of the conventional design and the design of this invention, respectively. These are shown as ranges as the working temperature can differ based on tolerances of different layers. Further, 1103 and 1107 depicts the nominal working temperature for X coil of the conventional design and the design of this invention, respectively. It is noted that improvements of the embodiments of current invention have advantageously lowered the nominal working temperature of the X coil.

Similarly, graphs 1109 and 1113 illustrate the range of working temperatures for Y coil of the conventional design and the design of this invention, respectively. Further, 1111 and 1115 depicts the nominal working temperature for Y coil of the conventional design and the design of this invention, respectively. Therefore, the improvements of embodiments of current invention have advantageously lowered the nominal working temperature of the Y coil.

In similar manner, graphs 1117 and 1121 illustrate the range of working temperatures for Z coil of the conventional design and the design of this invention, respectively (improvements for the design of Z coil core is explained in more details later). Further, 1119 and 1123 depicts the nominal working temperature for Z coil of the conventional design and the design of this invention, respectively. Therefore, the improvements of embodiments of current invention have advantageously lowered the nominal working temperature of the Z coil. Also, 1125 and 1127 illustrate the maximum working temperatures.

Figure 11B:
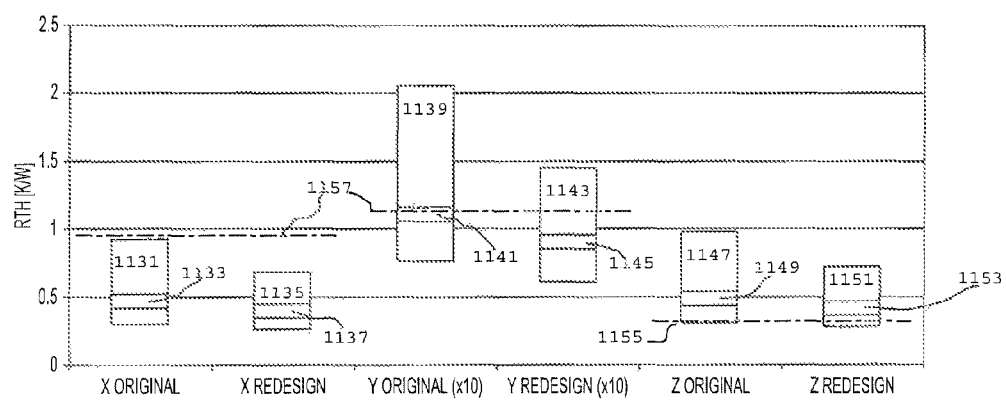
FIG. 11B illustrates a graph comparison of thermal resistance of X, Y, and Z coils between the conventional design and the design of the embodiments of the invention.

FIG. 11B illustrates a graph comparison of thermal resistance of X coils, Y coils, and Z coils between the conventional design and design of the embodiments of this invention.

For example, graphs 1131 and 1135 illustrate the range of thermal resistance for X coil of the conventional design and the design of this invention, respectively. Further, 1133 and 1137 depicts the nominal thermal resistance for X coil of the conventional design and the design of this invention, respectively. It is noted that improvements of embodiments of current invention have advantageously lowered the thermal resistance of the X coil.

Similarly, graphs 1139 and 1143 illustrate the range of thermal resistance for Y coil of the conventional design and the design of this invention, respectively. Further, 1141 and 1145 depicts the nominal thermal resistance for Y coil of the conventional design and the design of this invention, respectively. Therefore, the improvements of embodiments of current invention have advantageously lowered the nominal thermal resistance of the Y coils.

In similar manner, graphs 1147 and 1151 illustrate the range of thermal resistance for Z coil of the conventional design and the design of this invention, respectively. Further, 1149 and 1153 depicts the nominal thermal resistance for Z coil of the conventional design and the design of this invention, respectively. Therefore, the improvements of embodiments of current invention have advantageously lowered the nominal thermal resistance of the Z coils. Also, 1155 and 1157 illustrate the thermal resistance limits.

Figure 11C:
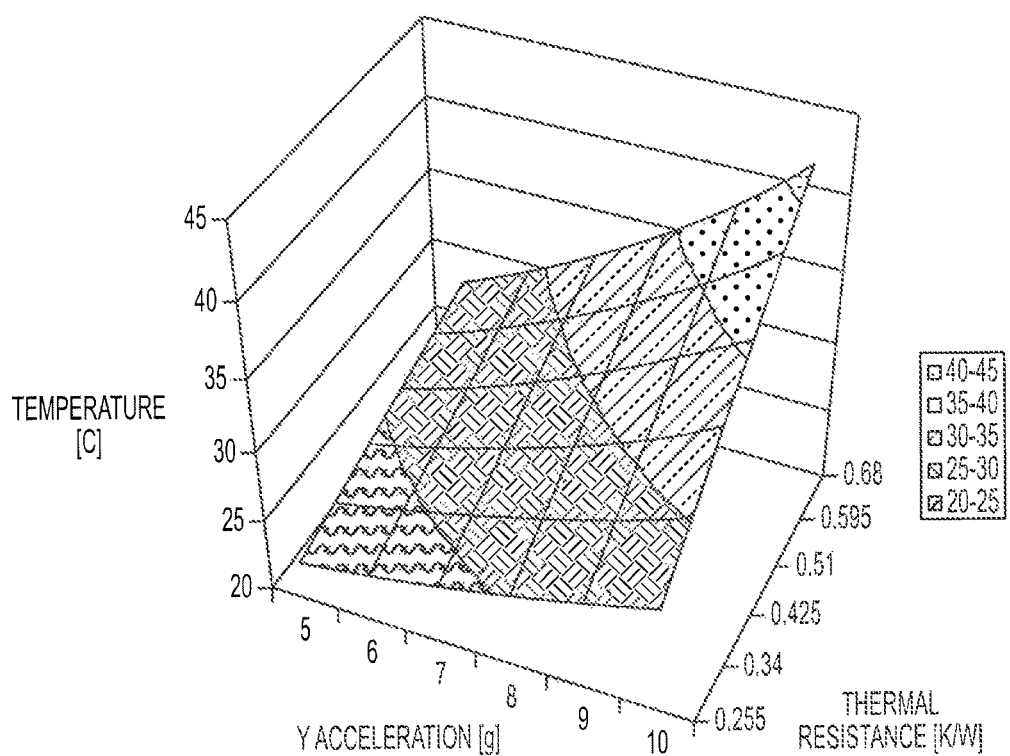
FIGS. 11C-11E illustrate average of X, Y, and Z motor temperatures, when the Y acceleration and/or thermal resistance changes.
Figure 11D:
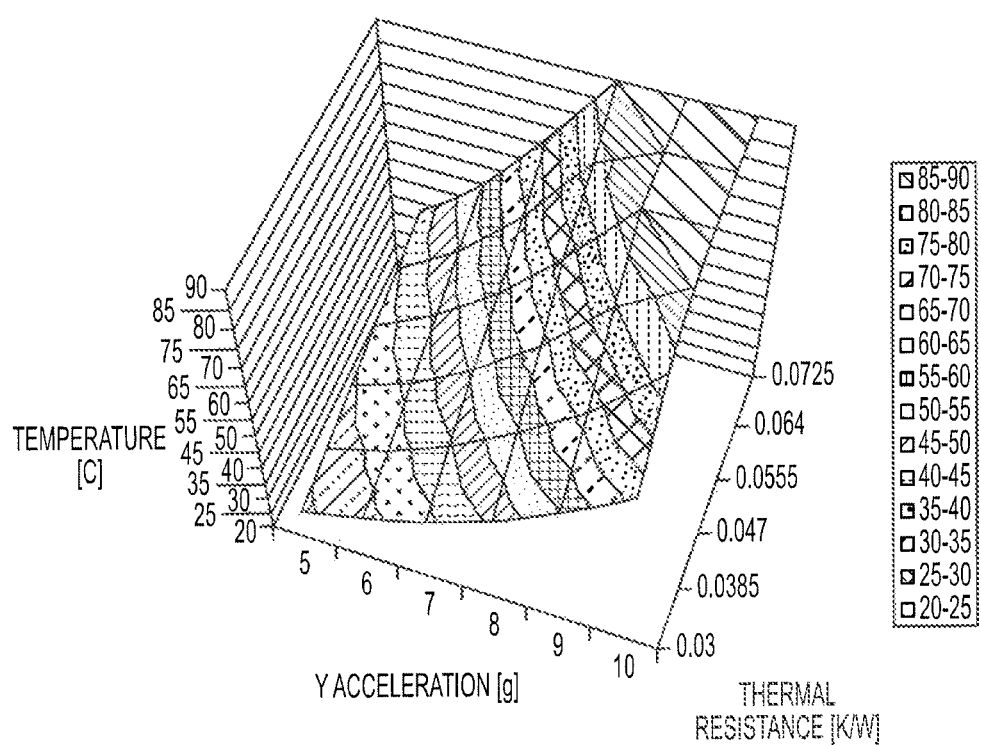
Figure 11E:
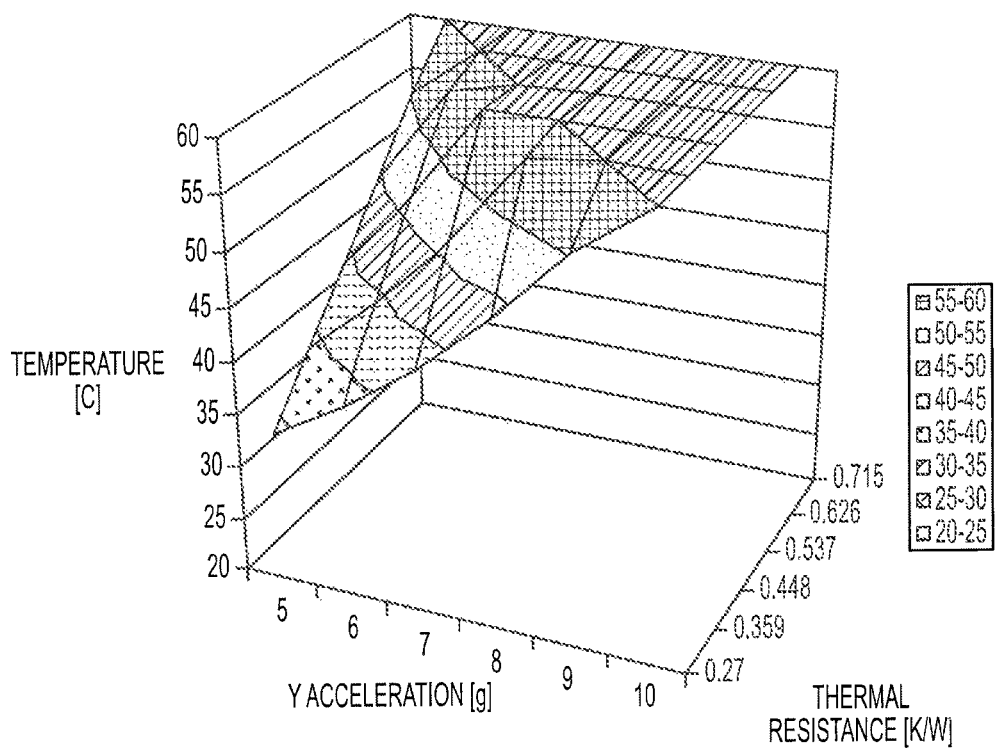

FIGS. 11C-11E illustrate average X, Y, and Z motor temperatures, respectively, when the Y acceleration and/or the thermal resistance is changed.

FIGS. 12A-12D illustrate exemplary embodiments of Y and X flat wire coil designs, according to one exemplary embodiment.

Figure 12A:
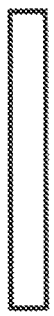
FIGS. 12A-12D illustrate exemplary embodiments of Y and X flat wire coil designs, according to an embodiment of the invention.
Figure 12B:
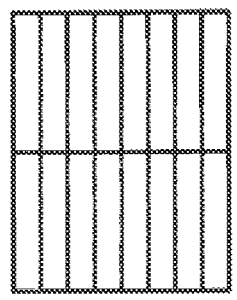

FIGS. 12A and 12B depict the wire cross section and a flat wire coil design for a Y flat wire coil. According to one exemplary embodiment of the Y flat wire coil, the wire width can be approximately 100 μm, the wire height can be approximately between 2-2.005 mm, the cross section of the wire can be approximately between 2-2.005 mm$^2$, and the thickness of the insulation of the wire can be approximately 10 μm. According to this exemplary embodiment, the number of turns can be approximately 466 turns, number of sub-coils can be 2, and the number of turns per sub-coil can be approximately 233. In this example, the sub-coil thickness can be approximately 2.025 mm, the gap between sub-coils can be approximately 0.1 mm, the coil width can be approximately 27.96 mm, total coil height can be approximately 4.15 mm, and the resistance of the coil can be approximately 11.6 ohms (Ω).

Figure 12C:
Figure 12D:
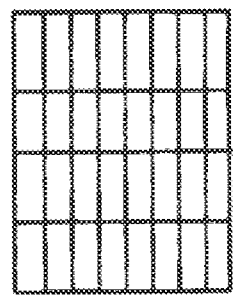

FIGS. 12C and 12D depict the wire cross section and a flat wire coil design for a X flat wire coil. According to one exemplary embodiment of the X flat wire coil, the wire width can be approximately 140 μm, the wire height can be approximately between 0.9-0.93 mm, the cross section of the wire can be approximately between 0.126-0.1302 mm$^2$, and the thickness of the insulation of the wire can be approximately 10 μm. According to this exemplary embodiment, the number of turns can be approximately 180 turns, the number of sub-coils can be 4, and the number of turns per sub-coil can be approximately 45. In this example, the sub-coil thickness can be approximately 0.95 mm, the gap between sub-coils can be approximately 0.1 mm, the coil width can be approximately 7.2 mm, total coil height can be approximately 4.1 mm, and the resistance of the coil can be approximately 3.2Ω.

Figure 13A:
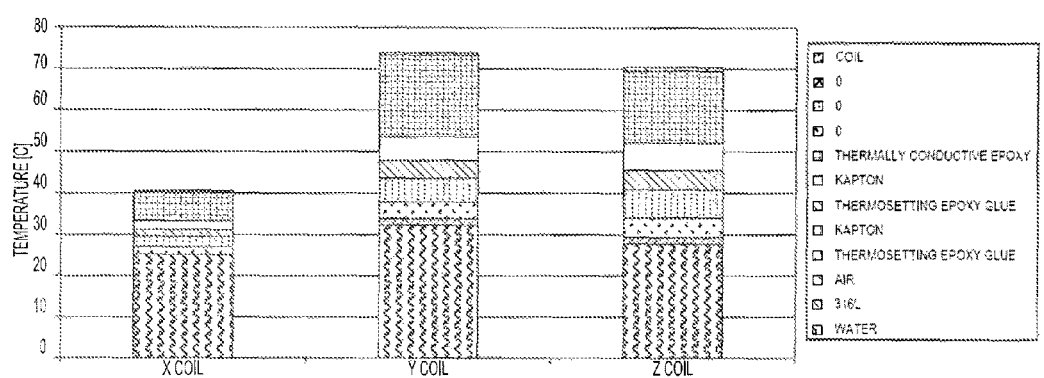
FIGS. 13A and 13B illustrate the temperature distribution along different layers of X, Y, and Z coils.
Figure 13B:
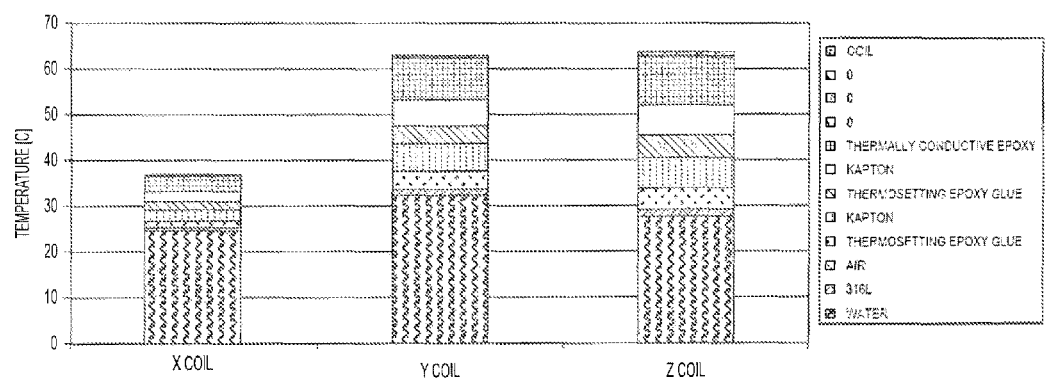

FIGS. 13A and 13B illustrate the temperature distribution along different layers of the X, Y, and Z coils for the conventional design and the design according to embodiments of this invention, respectively.

More specifically, FIG. 13A depicts the temperature of layers, such as, water, cooling plate (316 L), air, thermosetting epoxy glue layer, Kapton layer, thermally conductive epoxy layer, and coil, for X, Y, and Z coils of the conventional design. Also, FIG. 13B depicts the temperature of layers, such as, water, cooling plate (316 L), air, thermosetting epoxy glue layer, Kapton layer, thermally conductive epoxy layer, and coil, for X, Y, and Z coils of the design according to embodiments of this invention. It can be noted that the design according to embodiments of this invention, can advantageously lower the working temperature of the coil for the X, Y, and Z coils.

Figure 14A:
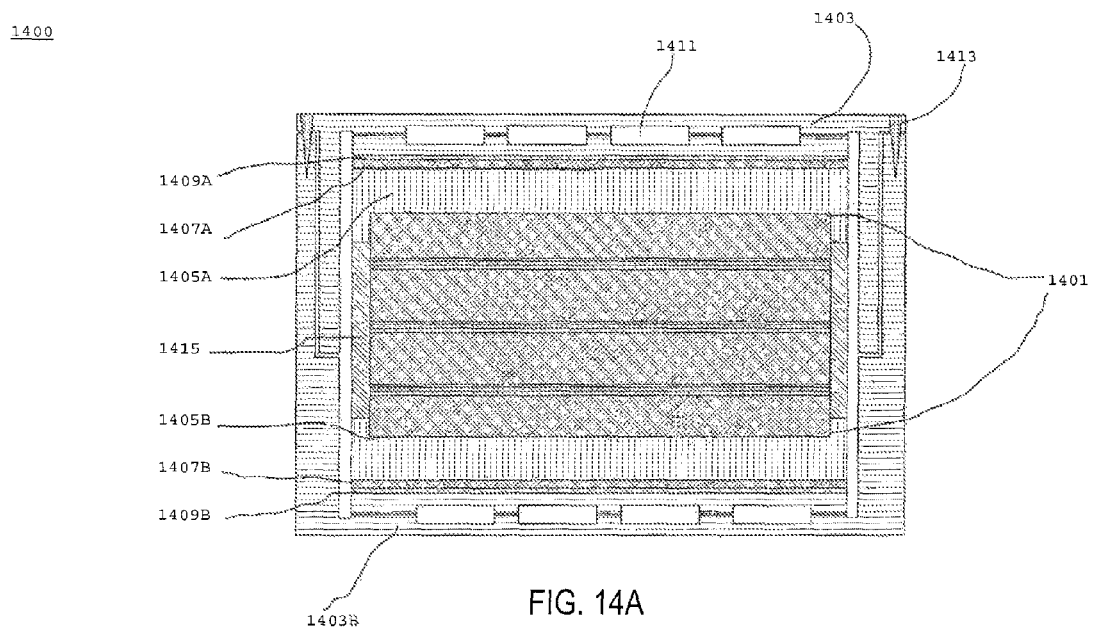
FIGS. 14A-14C illustrate improvements to design of a Z motor, according to embodiments of this invention.
Figure 14B:
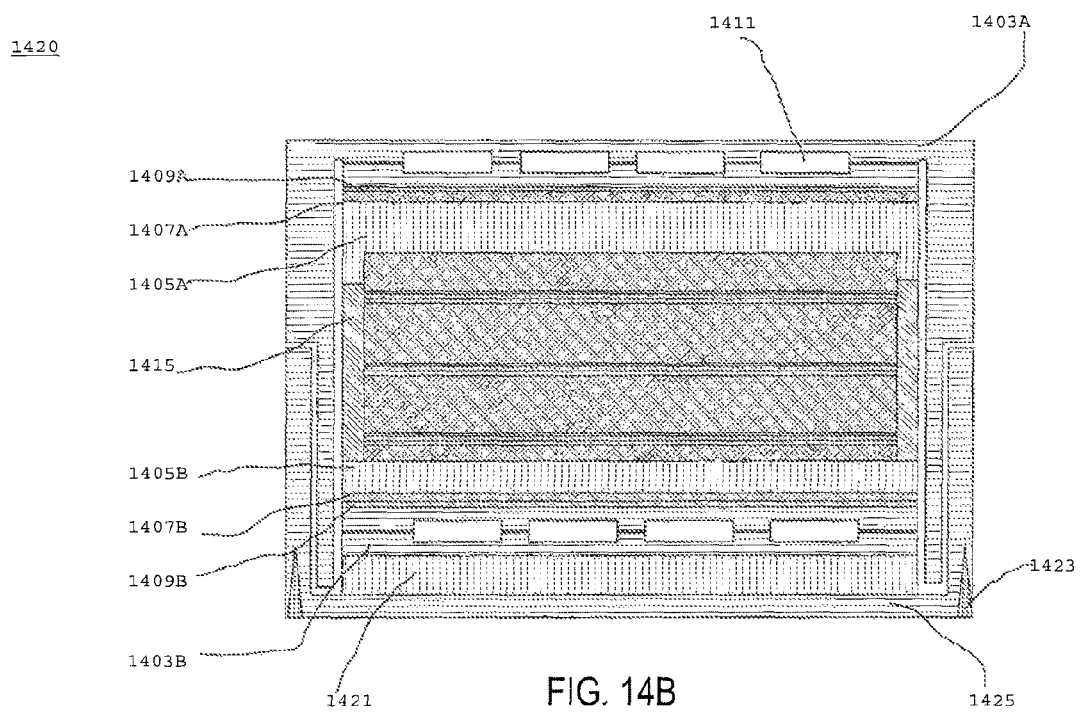
Figure 14C:
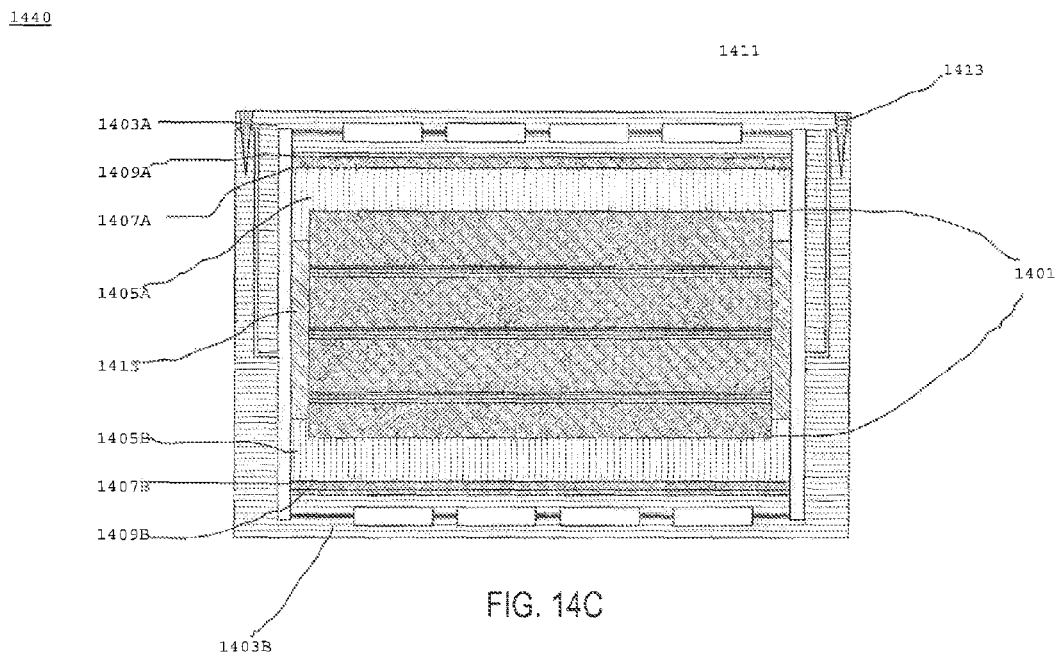

FIGS. 14A-14C further illustrate improvements to design of a Z motor, according to exemplary embodiments of this invention.

According to the example of FIG. 14A, the design of the Z motor 1400 includes a flat wire coil 1401 in place of a round coil that is currently used in the conventional design of the Z motor. As illustrated in FIG. 14A, the Z coil 1401 is positioned between two cooling plates 1403A and 1403B (collectively as cooling plates 1403). In one example, the cooling plates 1403 can include two or more stainless steel plates that are brazed together using a brazing material. Also, the cooling plates 1403 can include the cooling channels 1411. The cooling plates 1403 are part of the housing structure of the Z motor 1400. As depicted in FIG. 14A, the housing structure of the Z motor 1400 can include two sections, a first section that includes the cooling plate 1403A and a second section that includes the cooling plate 1403B. These two sections of the housing structure are brazed together at 1413.

In one example, two layers of thermally conductive epoxy 1405A and 1405B (collectively as thermally conductive epoxy layers 1405) are inserted between the cooling plates 1403 and the Z coil 1401. Fiberglass frames 1415 can also be positioned the in the Z motor 1400 to support the Z coil 1401. According to an embodiment, thermosetting epoxy glue layers 1409A and 1409B, and Kapton layers 1407A and 1407B are also inserted between the thermally conductive epoxy layers 1405 and the cooling plates 1403. In one example, the Kapton layers 1407A and 1407B can each include two layers of Kapton.

The improvements depicted in FIG. 14A can advantageously increase the thickness of the thermally conductive epoxy layer 1405. In one example, the thickness car be increased to 80-200 μm. Moreover, the embodiment of FIG. 14A can result in lower average thermal resistance. In addition the resistance of the coil, and therefore the generated heat is lowered, in some cases, by approximately 25%. Also, the design of FIG. 14A can be complied with the electrical safety regulations (as shown in FIG. 5C). In one example, the thermal resistance of the design of FIG. 14A can be approximately at 0.55 K/W, in comparison to 0.54 K/W of the conventional design with one Kapton layer and 0.65 K/W with two Kapton layers. In this example, the resistance of the coil can be approximately 8.3Ω compared to 10Ω of the conventional design. Also, the operating temperature can be approximately at 56° C. compared to 64° C. of the conventional design.

According to one example, the Z coil 1401 has a thickness of approximately 4.55 mm, the Kapton layer 1407 and the thermosetting epoxy layer 1409 together have a thickness of approximately 0.07 mm, and the gap between the Z coil 1401 and the cooling Kapton layer 1407 (which is filled by the thermally conductive epoxy layer 1405) is approximately 0.15 mm. In this example, the thickness of the cooling plate 1403 is approximately 1.5 mm. Therefore, according to this example, the thickness of the Z motor 1400 is approximately 8 mm. However, it is contemplated that other thicknesses can be used for the design of the Z motor 1400.

FIG. 14B illustrates another exemplary embodiment of the invention with further improvements in the Z motor 1420. Similar layers in the Z motor 1420 of FIG. 14B and the Z motor 1400 of FIG. 14A are labeled similarly. In addition to using the flat wire Z coil 1401, the embodiment of FIG. 14B includes an undeterministic glue layer 1421 and therefore the cooling plate 1403B would act as a floating cooling plate.

Also, it is noted that the thermally conductive epoxy layers 1405 of FIG. 14B are deterministic thermally conductive epoxy layers. Thus, shims (not shown) are positioned between the cooling plates 1403 and the Z coil 1401 to deterministically define the thickness of the thermally conductive epoxy layers 1405. Therefore, the distance between the Z coil 1401 and the top cooling plate 1403A and also the distance between the Z coil 1401 and the floating cooling plate 1403B can be controlled. In the embodiment of FIG. 14B, the cooling plate 1403A is part of the housing structure. However, the floating cooling plate 1403B is not part of the housing structure. Instead, the lid 1425 is used to close the housing. The undeterministic glue layer 1421 is inserted only in the bottom part of the Z motor 1420 and can be used to compensate for any tolerances in different layers.

Similar improvements of the embodiment of FIG. 14A is achieved by the design of FIG. 14B. Also, the embodiment of FIG. 14B can improve motor testing capabilities at sub-assembly level to detect defects and failures before the motor is fully assembled, therefore, increases the testability of sub-components. Further, the design of FIG. 14B also decreases welding contamination of the welding area and thermal damages to Kapton layers. In one example, the thermal resistance of the design of FIG. 14B can be approximately at 0.46 K/W, in comparison to 0.54 K/W of conventional design with one Kapton layer and 0.65 K/W with two Kapton layers. In this example, the resistance of the coil can be approximately 8.3Ω compared to 10Ω of the conventional design. Also, the operating temperature can be approximately at 51 C compared to 64 C of the conventional design.

According to one example, the Z coil 1401 of FIG. 14B has a thickness of approximately 4.55 mm, the Kapton layer 1407 and the thermosetting epoxy layer 1409 together have a thickness of approximately 0.07 mm, and the gap between the Z coil 1401 and the cooling Kapton layer 1407 (which is filled by the thermally conductive epoxy layer 1405) is approximately 0.08 mm. In this example, the thickness of the cooling plate 1403 is approximately 1.2 mm, the thickness of the lid 1425 is approximately 0.5 mm, and the thickness of the undeterministic layer 1421 is approximately 0.2 mm. Therefore, according to this example, the thickness of the Z motor 1420 is approximately 8 mm. However, it is contemplated that other measurements can be used for the design of the Z motor 1420.

FIG. 14C illustrates another exemplary embodiment of the invention with further improvements in the Z motor 1440. In the design of the Z motor 1440, the thickness of the Z coil 1401 has increased so that the heat generated by the Z motor 1440 is decreased. The bigger Z coil 1401 results in more copper, which decreases the resistance.

According to one example, the Z coil 1401 of FIG. 14C has a thickness of approximately 5 mm, the Kapton layer 1407 and the thermosetting epoxy layer 1409 together have a thickness of approximately 0.07 mm, and the gap between the Z coil 1401 and the cooling Kapton layer 1407 (which is filled by the thermally conductive epoxy layer 1405) is approximately 0.2 mm. In this example, the thickness of the cooling plate 1403 is approximately 1.2 mm. Therefore, according to this example, the thickness of the Z motor 1420 is approximately 8 mm. However, it is contemplated that other measurements can be used for the design of the Z motor 1440.

In this example, the thermal resistance of the Z motor 1440 can be approximately at 0.61 K/W, in comparison to 0.54 K/W of conventional design with one Kapton layer and 0.65 K/W with two Kapton layers. In this example, the resistance of the coil can be approximately 7.5Ω compared to 10Ω of the conventional design. Also, the operating temperature can be approximately at 57° C. compared to 64° C. of the conventional design.

IV. Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A system comprising:
    a core comprising:
        a plurality of cooling plates;
        a plurality of electrical coils sandwiched between the plurality of cooling plates;
        a plurality of thermally conductive epoxy layers positioned between the plurality of electrical coils and the plurality of cooling plates; and
        a plurality of shims located between the plurality of electrical coils and the plurality of cooling plates to determine a distance therebetween,
        wherein the core is configured to be tested before assembling with a housing; and
    the housing configured to enclose the core, the housing comprising a body, a plurality of feed throughs, and a lid.

2. The system of claim 1, wherein the core further comprises:
    a plurality of Kapton layers located between the plurality, of thermally conductive epoxy layers and the plurality of cooling plates.

3. The system of claim 2, wherein the core further comprises a plurality thermosetting epoxy glue layers located between the plurality of Kapton layers and the plurality of cooling plates using.

4. The system of claim 1, wherein the core further comprises a plurality of sensors.

5. The system of claim 4, wherein the plurality of sensors further comprises:
    a plurality of temperature sensors configured to measure a temperature of the core; and
    a plurality of safety sensors configured to halt an operation of the system if the temperature of the core exceeds a threshold.

6. The system of claim 1, wherein the plurality of electrical coils include at least one X coil and one Y coil, each of the X and Y coils including a top structure and a bottom structure.

7. The system of claim 6, wherein the core further includes a plurality of fiberglass frames configured to support the X and Y coils.

8. The system claim 1, further comprising:
    a plurality of glue layers located between the housing and the core; and
    a filing piece located inside the housing and between the core and the lid.

9. The method of claim 8, wherein:
    the plurality of glue layers located between the housing and the core are mechanically strong epoxy layers.

10. The system of claim 1, wherein the plurality of teed throughs of the housing include feed throughs for electric wires and water connections of the core and the plurality of feed throughs are sealed.

11. The system of claim 1, wherein the plurality of cooling, plates further comprise:
    a plurality of stainless steel plates brazed together; and
    a plurality of cooling channels.

12. The system of claim 1, wherein the distance between the plurality of electrical coils and the plurality of cooling plates is different at various locations between the plurality of electrical coils and the plurality of cooling plates.

13. A method for fabricating a motor, comprising:
    assembling a core, comprising:
        positioning a plurality of electrical coils between a plurality of cooling plates;
        positioning a plurality of thermally conductive epoxy layers between the plurality of electrical coils and the plurality of cooling plates;
        positioning a plurality of shims between the plurality of electrical coils and the plurality of cooling plates to determine a distance therebetween; and
        curing the plurality of thermally conductive epoxy layers; and
    inserting the core inside a housing,
    wherein the core is configured to be tested before being inserted in the housing.

14. The method of claim 13, wherein the assembling a core further comprises:
    positioning a plurality of Kapton layers between the plurality of thermally conductive epoxy layers and the plurality of cooling plates.

15. The method of claim 14, wherein the plurality of Kapton layers are mechanically connected to the plurality of cooling plates using a plurality thermosetting epoxy glue layers.

16. The method of claim 13, further comprising:
    positioning a filing piece inside the housing and between the core and a lid of the housing;
    applying a plurality of glue layers between the housing and the core; and
    curing the plurality of glue layers.

17. The method of claim 16, wherein the plurality of glue layers applied between the housing and the core comprise mechanically strong epoxy layers.

18. The method of claim 16, further comprising:
    welding the lid of the housing to a body of the housing; and
    sealing a plurality of feed throughs of the housing, wherein the plurality of feed throughs include feed throughs for electric wires and water connections of the core.

19. The system of claim 13, wherein the distance between the plurality of electrical coils and the plurality of cooling plates is different at various locations between the plurality of electrical coils and the plurality of cooling plates.

20. A lithographic apparatus comprising:
    an illumination system for providing a beam of radiation;
    a support structure for supporting a patterning device, the patterning device serving to impart the radiation beam with a pattern in its cross-section;
    a substrate table for holding a substrate;
    a projection system for projecting the patterned radiation beam onto a target portion of the substrate; and
    a motor comprising:
    a core comprising:
        a plurality of cooling plates;
        a plurality of electrical coils sandwiched between the plurality of cooling plates;
        a plurality of thermally conductive epoxy layers positioned between the plurality of electrical coils and the plurality of cooling plates; and
        a plurality of shims located between the plurality of electrical coils and the plurality of cooling plates to determine a distance therebetween,
        wherein the core is configured to be tested before assembling with a housing; and
    the housing configured to enclose the core, the housing comprising a body, a plurality of feed throughs, and a lid.

* * * * *

UNITED STATES PATENT AND TRADEMARK OFFICE
CERTIFICATE OF CORRECTION

PATENT NO.        : 8,885,148 B2
APPLICATION NO.   : 13/315194
DATED             : November 11, 2014
INVENTOR(S)       : Enrico Zordan Page 1 of 1

It is certified that error appears in the above-identified patent and that said Letters Patent is hereby corrected as shown below:

In the Claims

In column 22, line 9, claim 3, after "plurality", please insert --of--.
In column 22, line 11, claim 3, delete "using".
In column 22, line 36, claim 10, please delete "teed" and insert --feed--.
In column 22, line 40, claim 11, after "cooling", please delete second occurrence ",".

Signed and Sealed this
Nineteenth Day of May, 2015

Michelle K. Lee
*Director of the United States Patent and Trademark Office*